United States Patent
Yamamoto et al.

(10) Patent No.: US 7,859,283 B2
(45) Date of Patent: Dec. 28, 2010

(54) PROBE APPARATUS, PROBING METHOD, AND STORAGE MEDIUM

(75) Inventors: Yasuhito Yamamoto, Nirasaki (JP); Masaru Suzuki, Nirasaki (JP); Junichi Hagihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 156 days.

(21) Appl. No.: 12/389,913

(22) Filed: Feb. 20, 2009

(65) Prior Publication Data

US 2009/0212803 A1 Aug. 27, 2009

(30) Foreign Application Priority Data

Feb. 22, 2008 (JP) .............. 2008-040784

(51) Int. Cl.
*G01R 31/02* (2006.01)

(52) U.S. Cl. ..................................... 324/758

(58) Field of Classification Search ......... 324/750–758; 382/181–232; 356/614–640
See application file for complete search history.

(56) References Cited

U.S. PATENT DOCUMENTS

| | | | | |
|---|---|---|---|---|
| 5,349,735 A * | 9/1994 | Kawase et al. | ............ | 29/407.05 |
| 5,644,245 A * | 7/1997 | Saitoh et al. | ................ | 324/754 |
| 5,708,222 A * | 1/1998 | Yonezawa et al. | .......... | 73/865.8 |
| 5,999,268 A * | 12/1999 | Yonezawa et al. | ............ | 356/399 |
| 6,002,426 A * | 12/1999 | Back et al. | .................... | 348/87 |
| 6,097,473 A * | 8/2000 | Ota et al. | ....................... | 355/53 |
| 6,838,892 B2 * | 1/2005 | Suzuki | ......................... | 324/754 |
| 6,906,546 B2 * | 6/2005 | Tanioka et al. | .............. | 324/765 |
| 7,015,711 B2 * | 3/2006 | Rothaug et al. | .............. | 324/758 |
| 7,091,733 B2 * | 8/2006 | Takekoshi et al. | ............ | 324/760 |
| 7,242,206 B2 * | 7/2007 | Takekoshi et al. | ............ | 324/760 |
| 7,297,975 B2 * | 11/2007 | Ufert | ............................... | 257/2 |
| 7,319,336 B2 * | 1/2008 | Baur et al. | .................... | 324/751 |
| 7,463,764 B2 * | 12/2008 | Miura et al. | ................... | 382/145 |
| 7,538,564 B2 * | 5/2009 | Ehrmann et al. | ............. | 324/752 |
| 7,553,334 B2 * | 6/2009 | Hazaki et al. | ................... | 850/8 |
| 7,583,099 B2 * | 9/2009 | Kagami | ....................... | 324/758 |
| 7,701,236 B2 * | 4/2010 | Akiyama et al. | ............. | 324/758 |
| 7,719,297 B2 * | 5/2010 | Takabe et al. | ................. | 324/758 |
| 7,724,007 B2 * | 5/2010 | Yamamoto et al. | ........... | 324/758 |
| RE41,515 E * | 8/2010 | Hagihara et al. | ............. | 324/754 |
| 7,777,511 B2 * | 8/2010 | Hagihara | ..................... | 324/758 |
| 7,791,362 B2 * | 9/2010 | Hagihara | ..................... | 324/758 |
| 2008/0290886 A1 * | 11/2008 | Akiyama et al. | ............. | 324/758 |
| 2009/0251163 A1 * | 10/2009 | Yamada et al. | .............. | 324/758 |

FOREIGN PATENT DOCUMENTS

JP 6-66365 8/1994

\* cited by examiner

*Primary Examiner*—Ha Tran T Nguyen
*Assistant Examiner*—Joshua Benitez
(74) *Attorney, Agent, or Firm*—Oblon, Spivak, McClelland, Maier & Neustadt, L.L.P.

(57) ABSTRACT

A probe apparatus is capable of being scaled-down and reducing a manufacturing cost thereof in a probe apparatus having a plurality of probe apparatus main bodies. A loader unit for transferring a wafer between carriers accommodating therein wafers and the probe apparatus main bodies includes: an upper camera for imaging the arrangement of chips to be inspected of the wafer; a lower camera for imaging probe needles; an X-Y-Θ stage for moving the position of the wafer W in a horizontal direction and a second loader mechanism for moving the wafer in a vertical direction. Accordingly, a fine alignment of the wafer is performed by the loader unit to adjust the position of the wafer.

13 Claims, 22 Drawing Sheets

(d)

PROBE APPARATUS, PROBING METHOD, AND STORAGE MEDIUM

FIELD OF THE INVENTION

The present invention relates to a technique for measuring electrical characteristics of a target object to be inspected by bringing probes into electrical contact with electrode pads of the target object.

BACKGROUND OF THE INVENTION

A probe apparatus for performing a probe test on a semiconductor wafer (hereinafter, referred to as a "wafer") is configured to control a position of a wafer chuck capable of moving in X, Y and Z directions and rotating about a Z axis (in a Θ direction) so that probes, e.g., probe needles, of a probe card are brought into contact with electrode pads of IC chips of the wafer, the probe card being provided above the wafer chuck which mounts thereon the wafer.

In order to make the probe needles precisely contact with the electrode pads of the IC chips on the wafer, the wafer surface is imaged by a camera provided at the probe apparatus and, also, the probe needles are imaged by a camera provided at, e.g., the wafer chuck. Next, based on the position of the wafer chuck during the imaging process, the position of the wafer chuck at which the electrodes contact with the probes is calculated, which is so-called "fine alignment".

Further, as for a method for bringing the probe needles into contact with the wafer, there is known a method for allowing a contact between the probe needles and the electrode pads at a time, the probe needles being provided at a probe card to correspond to respective electrode pads of the wafer. This method can increase a throughput, compared to a method in which a part of the electrode pads on the wafer are sequentially brought into contact with the probe needles.

In order to perform the above-described fine alignment, a movement region of the wafer chuck needs to be ensured. However, as the wafer is scaled up, the movement region is expanded, so that the probe apparatus is also scaled up. Moreover, a demand for a throughput increase leads to a development of a loader unit for loading a plurality of carriers or a common loader unit for a plurality of inspection units (probe apparatus main bodies) (see, Japanese Patent Laid-open Application No. H6-66365: FIG. 1). However, there is a trade-off relationship between a high throughput and a large occupation area of the apparatus. Further, the large occupation area of the apparatus increases the weight of the apparatus. Besides, each of the inspection units is provided with a table capable of moving in X, Y and Z directions, and the table is provided with a rotation unit for rotating the wafer chuck in a e direction. For that reason, the cost of the apparatus increases.

SUMMARY OF THE INVENTION

In view of the above, the present invention provides a probe apparatus capable of being scaled-down and reducing a manufacturing cost thereof in a probe apparatus having a plurality of probe apparatus main bodies (inspection units), a probing method and a storage medium storing therein a program for performing the probing method.

In accordance with an aspect of the present invention, there is provided a probe apparatus for inspecting a plurality of chips to be inspected by mounting on a substrate mounting table a substrate on which the chips are arranged and making a contact between probes of a probe card and electrode pads of the chips at a time.

The probe apparatus includes a load port for mounting thereon a carrier accommodating therein a plurality of substrates; a plurality of probe apparatus main bodies, each having a supporting unit for detachably supporting the substrate mounting table and vertically moving the substrate mounting table between an upper portion at which the electrode pads of the chips on the substrate contact with the probes of the probe card and a lower portion at which the substrate mounting table is transferred; a loader unit for transferring the substrate between the carrier of the load port and the probe apparatus main bodies; and a control unit for outputting a control signal to the loader unit and the probe apparatus main bodies.

The loader unit includes: a substrate transfer mechanism for transferring the substrate to and from the carrier; a mounting table transfer mechanism provided commonly for the supporting units in the probe apparatus main bodies, for transferring the substrate mounting table to and from the supporting unit; a rotation unit provided with the mounting table transfer mechanism, for rotating the substrate mounting table about a vertical axis; an XY moving unit for moving the rotation unit in X and Y directions; a first image imaging device provided at a portion which rotates by the rotation unit, for imaging the probes of the probe card; and a second image imaging device for imaging the electrode pads of the chips of the substrate mounted on the substrate mounting table on the mounting table transfer mechanism.

Further, the control unit adjusts, based on imaging results obtained by the first and the second imaging device of each of the probe apparatus main bodies, the position of the substrate mounting table on the mounting table transfer mechanism via the rotation unit and the XY moving unit so that the chips are made to contact with the probes, and outputs a control signal to transfer the substrate mounting table of which position has been adjusted from the mounting table transfer mechanism to a supporting unit of a corresponding probe apparatus main body and also to bring the electrode pads of the substrate on the substrate mounting table into contact with the probes.

Preferably, the mounting table transfer mechanism has an elevation mechanism for elevating the XY moving unit, and wherein an operation of transferring the substrate mounting table from the mounting table transfer mechanism to the supporting unit of the corresponding probe apparatus main body and bringing the electrode pads of the substrate on the substrate mounting table into contact with the probes is performed by transferring the substrate mounting table from the mounting table transfer mechanism to the supporting unit in a state where the electrode pads of the substrate on the substrate mounting table are brought into contact with the probes of the corresponding probe apparatus main body by the mounting table transfer mechanism.

The mounting table transfer mechanism preferably has a transfer mechanism main body for transferring the substrate mounting table, and the XY moving unit is provided at the transfer mechanism main body.

Further, the probe apparatus main bodies are preferably horizontally arranged, and the loader unit may be movable in parallel with the arrangement of the probe apparatus main bodies.

The probe apparatus may further includes a transfer unit for transferring the substrate between the substrate transfer mechanism and the mounting table transfer mechanism.

The transfer unit may have elevating pins for elevating the substrate; the substrate mounting table has through holes through which the elevating pins penetrate; and the substrate is raised by the elevating pins penetrating the substrate mounting table and then is transferred between the substrate transfer mechanism and the mounting table transfer mechanism.

In accordance with another aspect of the present invention, there is provided a probing method for inspecting a plurality of chips to be inspected by mounting on a substrate mounting table a substrate on which the chips are arranged and making a contact between probes of a probe card and electrode pads of the chips The probing method includes steps of: unloading the substrate from a carrier accommodating therein a plurality of substrate by a substrate transfer mechanism; transferring the substrate onto the substrate mounting table supported at a portion which rotates by a rotation unit by the substrate transfer mechanism with the use of the mounting table transfer mechanism including the rotation unit for rotating the substrate mounting table about a vertical axis and an XY moving unit for moving the rotation unit in X and Y directions; and imaging probes of a probe card of a probe apparatus main body selected from a plurality of probe apparatus main bodies by a first imaging device provided at a portion which rotates by the rotation unit.

The method further includes: imaging the electrode pads of the chips to be inspected of the substrate mounted on the substrate mounting table on the mounting table transfer mechanism by a second imaging device provided outside the probe apparatus main bodies; adjusting a position of the substrate mounting table on the mounting table transfer mechanism via the rotation unit and the XY moving unit so that the chips and the probes are made to contact with each other based on the imaging results obtained by the first and the second imaging device in each of the probe apparatus main bodies; and transferring the substrate mounting table of which position has been adjusted from the mounting table transfer mechanism to a supporting unit of a corresponding probe apparatus main body and bringing the electrode pads of the substrate on the substrate mounting table into contact with the probes.

The step of transferring the substrate mounting table from the mounting table transfer mechanism to the supporting unit of the corresponding probe apparatus main body and bringing the electrode pads of the substrate on the substrate mounting table into contact with the probes is preferable performed by transferring the substrate mounting table from the mounting table transfer mechanism to the supporting unit in a state where the electrode pads of the substrate on the substrate mounting table are brought into contact with the probes of the corresponding probe apparatus main body by the mounting table transfer mechanism.

The step of adjusting the substrate mounting table is preferably performed by the XY moving unit provided at the transfer mechanism main body of the mounting table transfer mechanism.

Preferably, the probe apparatus main bodies are horizontally arranged, and when the mounting table is transferred to the probe apparatus main body selected from the probe apparatus main bodies, the mounting table transfer mechanism moves in parallel with the arrangement of the probe apparatus main bodies so that the mounting table is transferred between the corresponding probe apparatus main body and the mounting table transfer mechanism.

Further, the step of transferring the substrate on the substrate mounting table is performed preferably by a transfer unit for transferring the substrate between the substrate transfer mechanism and the mounting table transfer mechanism.

The transfer unit may have elevating pins for elevating the substrate and the substrate mounting table has through holes through which the elevating pins penetrate. Further, the step of transferring the substrate to the substrate mounting table is preferably performed by transferring the substrate between the substrate transfer mechanism and the mounting table transfer mechanism in a state where the substrate is raised by the elevating pins penetrating the substrate mounting table.

In accordance with still another aspect of the present invention, there is provided a computer-executable storage medium storing therein a computer program, wherein the computer program has steps for performing the probing method described above.

In accordance with the present invention, in a probe apparatus having a plurality of probe apparatus main bodies for inspecting a plurality of chips to be inspected while bringing electrode pads of the chips to be inspected into contact with probes of a probe card in a state where a substrate where the chips to be inspected are arranged is mounted on a substrate mounting table, a loader unit for transferring the substrate between the probe apparatus and a carrier accommodating therein a plurality of substrates includes: a first image pick-up device for picking up an image of arrangement of the chips to be inspected on the substrate; a second image pick-up device for picking up images of the probe needles; and a XY moving unit and a rotation unit for adjusting a position of the substrate. Due to the presence of the above components, the fine alignment for adjusting the position of the substrate is performed in the loader unit and, thus, the fine alignment operation in each of the probe apparatus main bodies can be performed commonly by the corresponding loader unit.

Accordingly, the movement region of the substrate does not need to be ensured in the probe apparatus main bodies, which allows the probe apparatus to be scaled down. Besides, there arises no need to provide the rotation unit, the XY moving unit and the like in the probe apparatus main bodies, so that the cost can be reduced. Especially, as the number of the probe apparatus main bodies increases, the effects of miniaturization and cost reduction of the apparatus increases.

BRIEF DESCRIPTION OF THE DRAWINGS

The objects and features of the present invention will become apparent from the following description of embodiments, given in conjunction with the accompanying drawings, in which.

DETAILED DESCRIPTION

Figure 5:
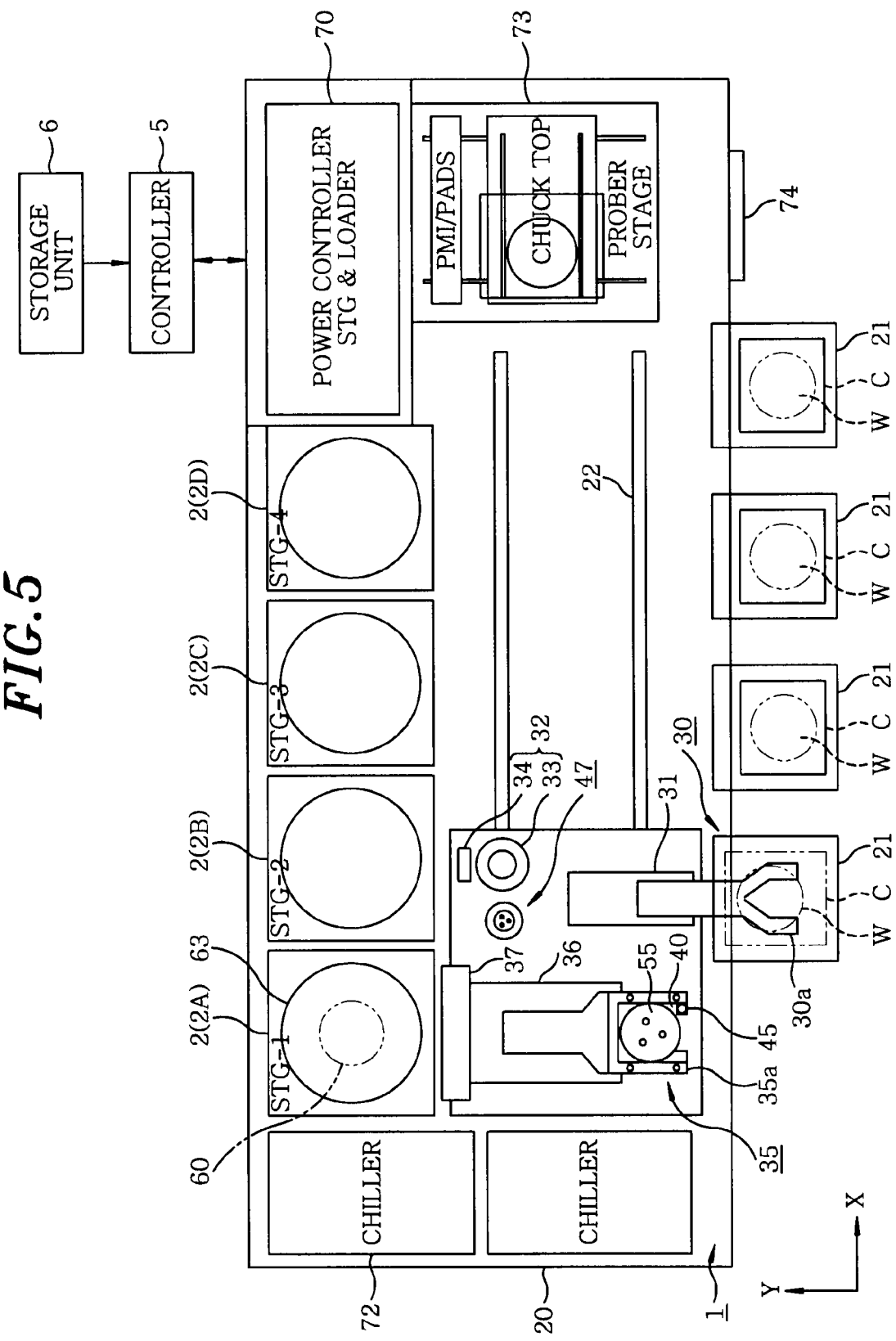
FIG. 5 represents a top view of the example of the probe apparatus.

The probe apparatus of the present invention will be described with reference to the accompanying drawings which form a part hereof. Reference will be made first to FIGS. 1 to 6. A housing 20 of the probe apparatus has, at a front portion thereof, a loader unit 1 for transferring a wafer W as a substrate having thereon a plurality of chips to be inspected and, at a rear portion thereof, a plurality of, e.g., four, probe apparatus main bodies 2 (2A to 2D) for probing the wafer W which are arranged in a lateral direction (X direction). Provided in a lateral direction (X direction) at an outer surface of the housing 20 in front of the loader unit 1 is a plurality of, e.g., four, mounting tables 21 as load ports for mounting thereon carriers C as transfer vessels accommodating therein a plurality of wafers W. When a transfer opening of a carrier C is pressed to the housing 20, the mounting tables 21 can move the carrier C back and forth by a driving mechanism (not shown) provided at the housing 20 so that a lid of the carrier C is separated from a shutter 2 provided at the housing 20. FIG. 5 schematically illustrates a position relationship among the loader unit 1, the probe apparatus main bodies 2 and the carriers C.

Two parallel rails 22 extending in a horizontal direction are disposed below the loader unit 1 in parallel with the arrangement of the mounting table 21 and the probe apparatus main bodies 2. Further, a base 23 moving along the rails 22 is provided on the rails 22. Provided at the front portion on the base 23 is a first loader mechanism 30 as a substrate transfer mechanism for transferring the wafer W to and from the carriers C. The first loader mechanism 30 has an arm 30a having bifurcated leading ends, a transfer body 31 for supporting and allowing the arm 30a to move back and forth, and a driving unit 31a for allowing the transfer body 31 to move vertically and rotate about a vertical axis.

Provided at the back side of the first loader mechanism 30 on the base 23 is a pre-alignment unit 32 for adjusting a direction of the wafer W or correcting a central position thereof. The pre-alignment unit 32 includes a rotation table 32 for rotating the wafer W about a vertical axis and a light emitting/receiving unit 34 having a top and a bottom between which an area including a circumferential portion of the wafer W mounted on the rotation table 33 is provided. By emitting light to the area including the circumferential portion of the wafer W while rotating the wafer W, it is possible to detect a path of the circumferential portion of the wafer W.

Moreover, disposed at the side of the pre-alignment unit 32 on the base 23 is a second loader mechanism 35 as a mounting table transfer mechanism for transferring the wafer W to and from the first loader mechanism 30 and to and from the probe apparatus main bodies 2. The second loader mechanism 35 has an arm 35a forming a transfer mechanism main body having bifurcated leading ends, a transfer body 36 for supporting and allowing the arm 35a to move back and forth, and a driving unit 36a as an elevation mechanism for allowing the transfer body 36 to move vertically and rotate about a vertical axis.

Figure 6:
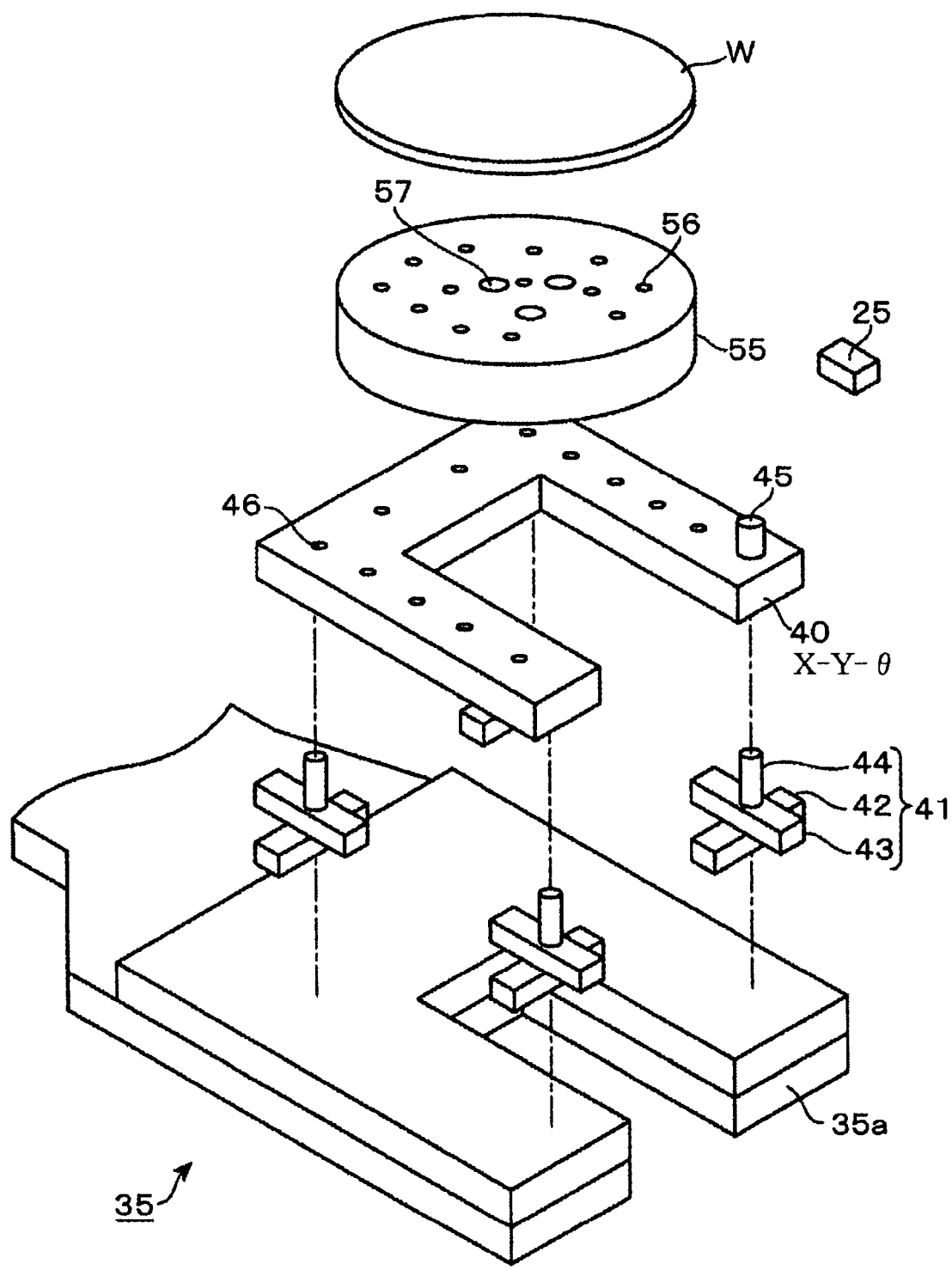
FIG. 6 offers an exploded perspective view of an example of a second loader unit in the probe apparatus.

As shown in FIG. 6, provided on the arm 35a of the second loader mechanism 35 is an X-Y-Θ stage 40 having an one side opened rectangular ring shape that opens in the same direction as the opening of the arm 35a. The X-Y-Θ stage 40 is fixed on the arm 35a by movable units 41 provided at, e.g., four corners on the bottom surface of the X-Y-Θ stage 40. Each of the movable units 41 has a rail 42 extending in a X direction, a rail 43 extending in a Y direction, and a rotation shaft 44 rotating about a vertical axis, which are laminated in that order from the bottom. The rotation shaft 44 can move in the X and Y directions by a motor (not shown) via the rails 42 and 43.

Further, the rotation shaft 44 is rotatably connected to the X-Y-Θ stage 40 via a roller ring or the like (not shown). Therefore, when four rotation shafts 44 move horizontally in the same direction, the X-Y-Θ stage 40 moves horizontally in that direction. Moreover, when rotation shafts 44 in each pair of diagonally located rotation shafts 44 move horizontally in opposite directions and two pairs thereof move in perpendicular directions to each other, the X-Y-Θ stage 40 rotates about a vertical axis. The rails 42 and 43 correspond to a XY moving unit to be described in claims, and the rotation shafts 44 correspond to a rotation unit. A lower camera 45 as a first image pick-up device having an upward view is provided at the leading end portion of the opening side of the X-Y-Θ stage 40. In addition, provided at the leading end side of the opening side of the X-Y-Θ stage 40 is a focusing unit 25, e.g., a thin plate having on a top and a bottom surface thereof markers such as metal films or the like are deposited or a half mirror that are movable horizontally by a driving mechanism (not shown).

Besides, a plurality of suction openings 46 is formed on the surface of the X-Y-Θ stage 40, and is connected to a suction unit (not shown) provided below the arm 35a via suction paths (not shown). Further, a plurality of suction openings 56 communicating with the above suction openings 46 is formed to vertically penetrate through a chuck top 55 as a substrate mounting table. The wafer W can be adsorptively held on the chuck top 55 (the X-Y-Θ stage 40) via the suction openings 46 and 56. Formed at, e.g., three portions of the chuck top 55 are through holes 57 for vertically moving elevating pins 49 as an elevation unit to be described later. In order to avoid repetition of the drawings, the suction openings 46 and 56 are illustrated only in FIG. 6.

An alignment bridge 37 extending in the lateral direction (X direction) is provided above the second loader mechanism 35, and an upper camera 38 serving as a second image pick-up device having a downward view is provided on a bottom surface of the alignment bridge 37. The alignment bridge 37 is supported on the base 23 via a supporting unit (not shown) to move in the lateral direction (X direction) together with the movement of the base 23.

Figure 1:
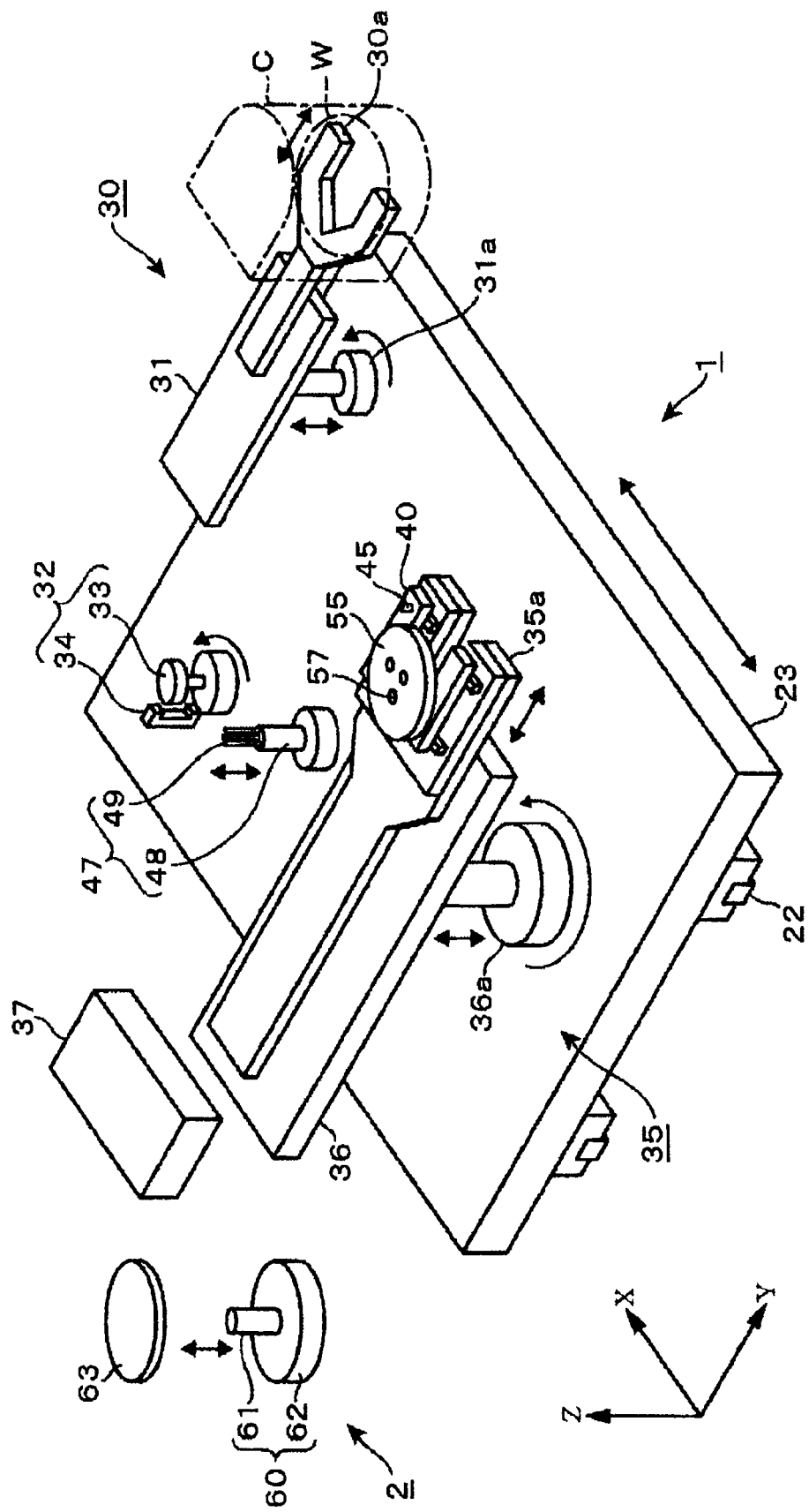
FIG. 1 is a perspective view entirely showing an example of a probe apparatus of the present invention.
Figure 2:
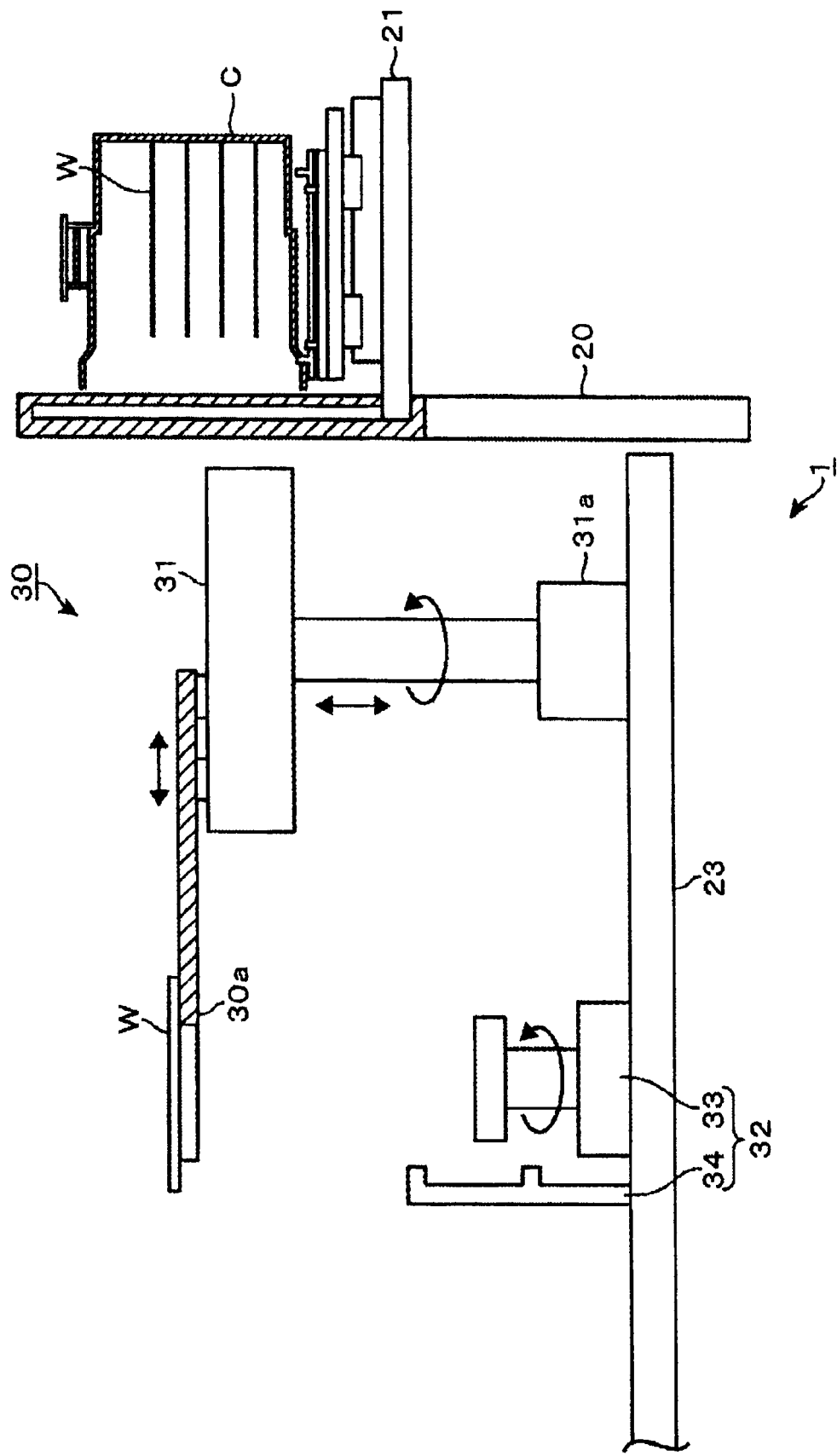
FIG. 2 describes a vertical cross sectional view of the example of the probe apparatus.
Figure 3:
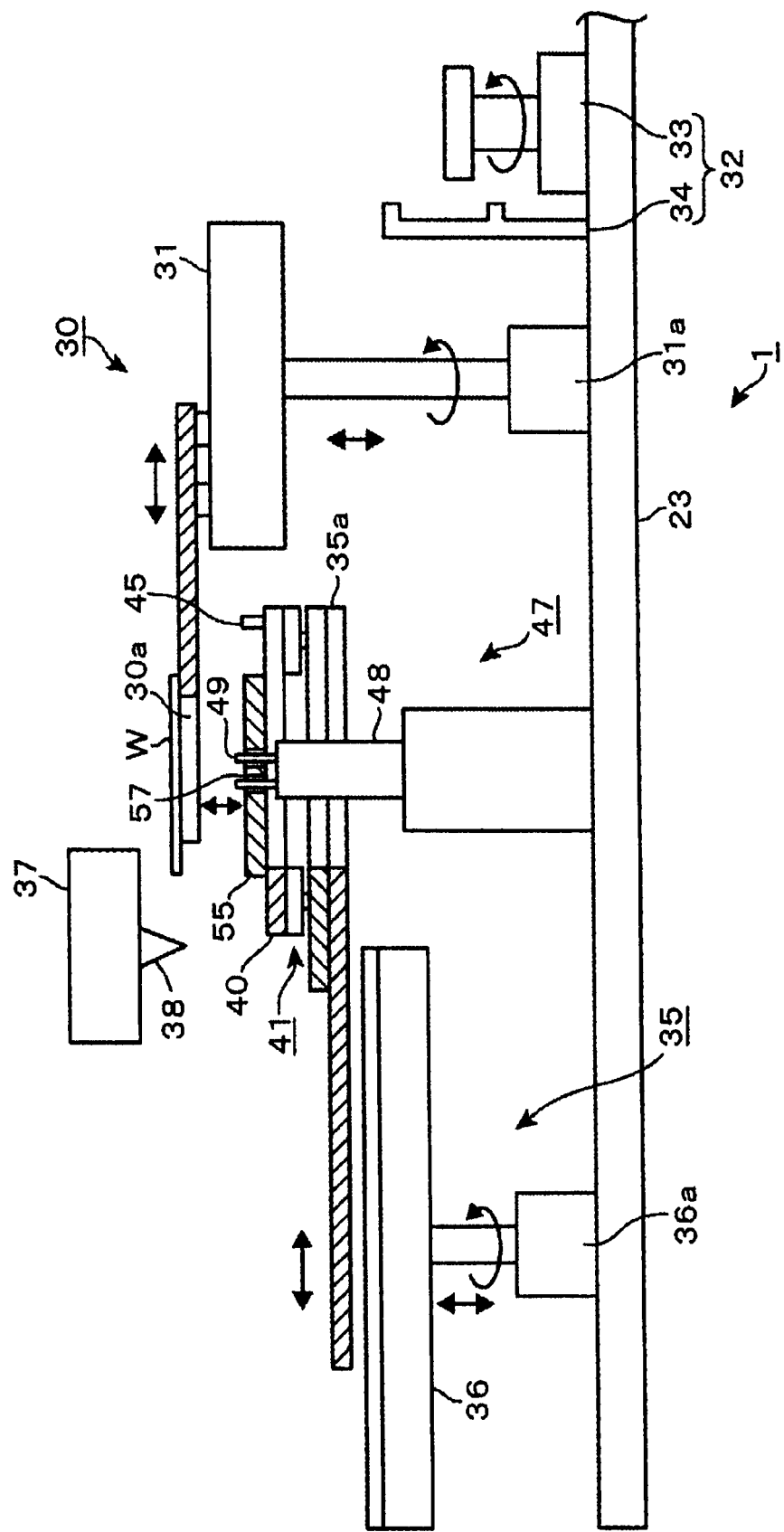
FIG. 3 provides a vertical cross sectional view of the example of the probe apparatus.
Figure 4:
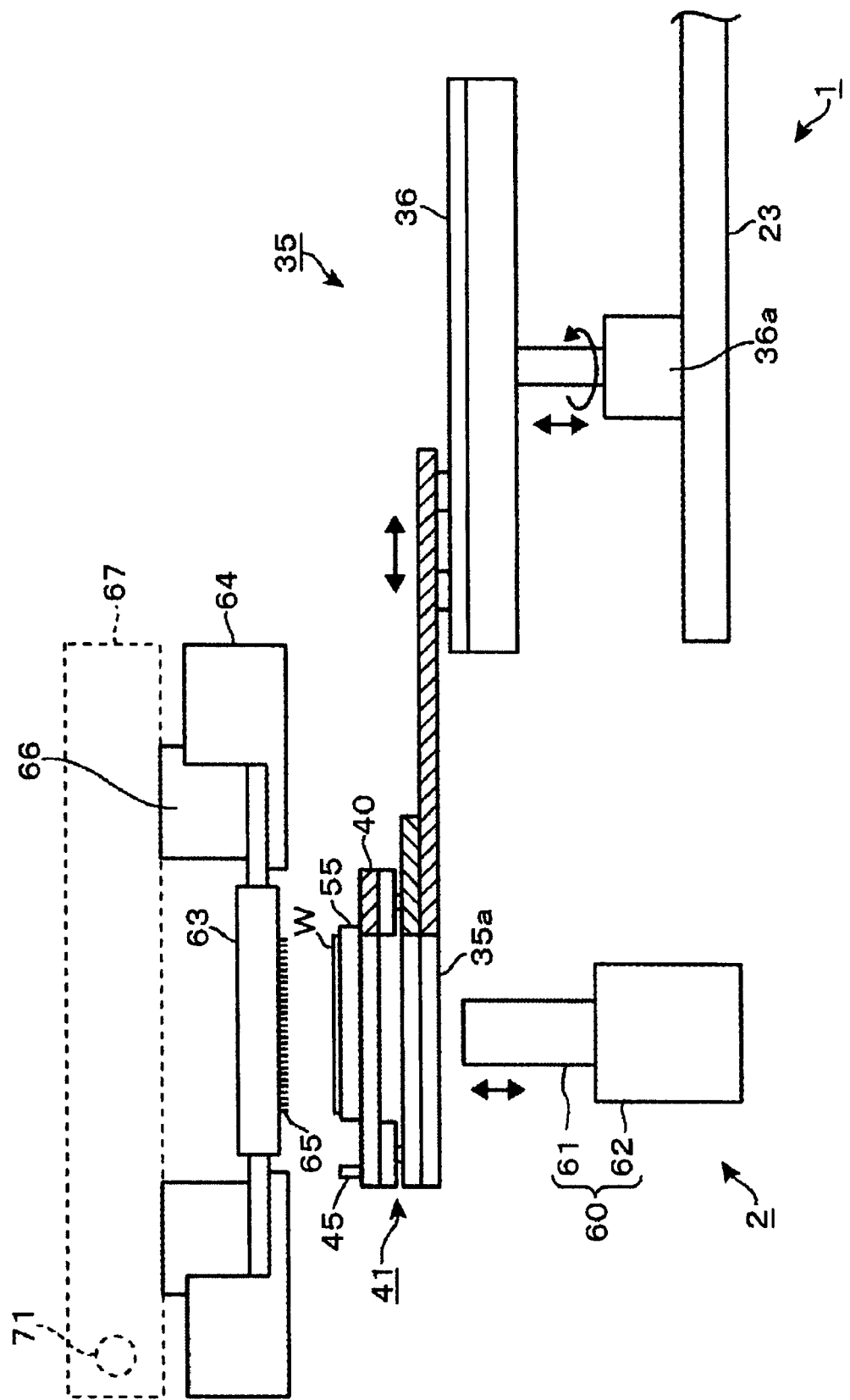
FIG. 4 presents a vertical cross sectional view of the example of the probe apparatus.

As can be seen from FIG. 1, a transfer mechanism 47 for transferring the wafer W between the first loader mechanism 30 and the second loader mechanism 35 is provided on the base 23 between the second loader mechanism 35 and the pre-alignment unit 32. The transfer mechanism 47 has a cylindrical supporting unit 48 having a width capable of being received within the opening of the arm 35a and the opening of the X-Y-Θ stage 40, and the elevating pins 49 formed of, e.g., three pins, which project and retreat with respect to the top surface of the supporting unit 48. In the side views of FIGS. 2 to 4, in order to avoid overlap of the second loader mechanism 35, the transfer mechanism 47 and the pre-alignment unit 32, the transfer mechanism 47 and the pre-alignment unit 32 are depicted to move in the lateral direction, these unit and mechanisms are illustrated in three drawings.

Hereinafter, the probe apparatus main bodies 2 will be described. In this example, as described above, the number of the probe apparatus main bodies 2 (2A to 2D) is four. Since they have the same configuration, the configuration of the probe apparatus main body 2 will be representatively described. Although it is not illustrated, the probe apparatus main bodies 2A to 2D are partitioned from one another by partition walls and the like and, also, the probe apparatus main bodies 2A to 2D are partitioned from the loader unit 1 by partition walls or the like.

A supporting unit 60 for sucking and supporting the chuck top 55 as the substrate mounting table for mounting thereon the wafer W is provided at an inner lower portion of the probe apparatus main body 2. The supporting unit 60 includes a cylindrical elevation unit 61 having a width capable of being received within the opening of the arm 35a and the opening of the X-Y-Θ stage 40 and a driving unit 62 having a motor or the like for vertically moving the elevation unit 61, the driving unit 62 being connected to a bottom portion of the elevation unit 61.

In addition, a probe card 63 is provided at a ceiling wall portion of the probe apparatus main body 2 to face the wafer W mounted on the chuck top 55. The probe card 63 is detachably fixed to the ceiling wall portion via a head plate 64. A plurality of probe needles 65 is formed on the entire bottom surface of the probe card 63 to correspond to the electrode pads so that, e.g., the electrode pads on the chips to be inspected formed on the wafer surface can be inspected at a time. Further, electrodes (not illustrated) electrically connected to the probe needles 65 are formed on the top surface of the probe card 63. A test head 67 is provided above the probe card 63 via a pogo ring 66, and a predetermined electrical testing signal is transferred from the test head 67 to the electrode pads of the wafer W via the pogo ring 66, the probe card 63 and the probe needles 65.

Moreover, the test head 67 is rotatable about one side of the test head 67 by a hinge 71 disposed at the upper portion of the probe apparatus main body 2. For example, the test head 67 is configured to rotate to the upper position when exchanging the probe card 63 disposed inside the probe apparatus main body 2.

Although the illustration is omitted in FIGS. 1 to 4, chillers 72 for controlling a temperature of the chuck top 55 is connected to each of the rear portion and the front portion of the probe apparatus while being connected to the side surface thereof, and heat is exchanged between the chuck top 55 and a temperature control fluid supplied from the chillers 72 via, e.g., a temperature control fluid path (not shown) formed between the chillers 72 and the supporting unit 60, as can be seen from FIG. 5. Further, a power supply 70 is provided at a rear portion of a side surface of the probe apparatus which is at the opposite side of the chillers 72s, and a prober stage 73 moving in X and Y directions is provided at the front thereof.

The prober stage 73 is used to align the wafer W. A reference numeral 74 in FIG. 5 represents a monitor for inputting recipes for inspection.

Further, the probe apparatus includes a control unit 5 which is, e.g., a computer. The control unit 5 has a data processing unit including a program, a memory, a CPU or the like. The program has multiple steps for controlling a series of operations of each unit which includes loading the carrier C onto the mounting table 21, inspecting the wafer W, returning the wafer W to the carrier C and unloading the carrier C. Furthermore, the program (including a program for input manipulation of processing parameters or display) is stored in a storage medium 6, e.g., a flexible disk, a compact disk, an MO (magneto-optical) disk, a hard disk or the like, and is installed in the control unit 5.

Figure 7A:
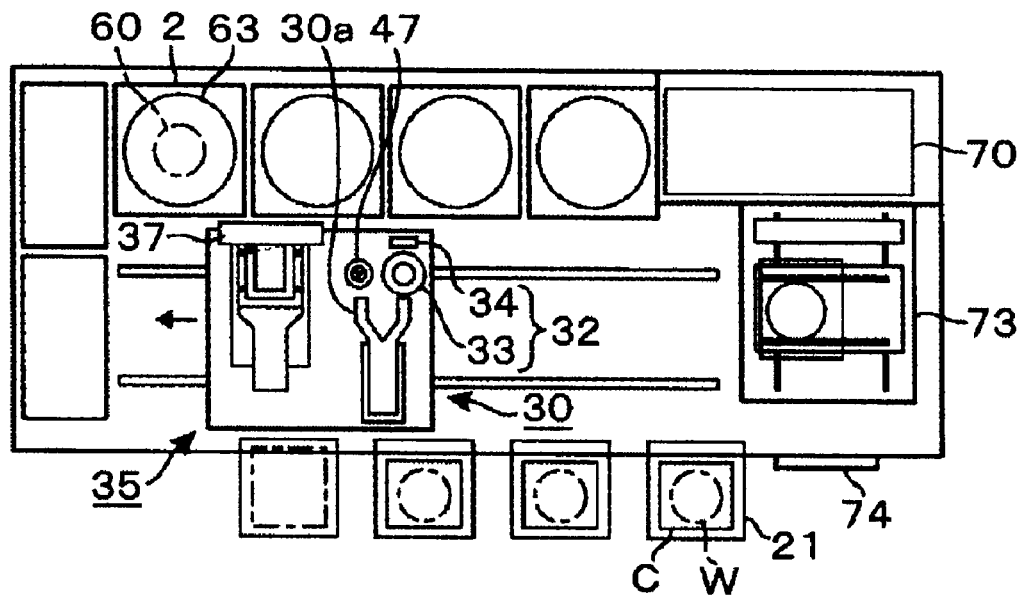
FIG. 7 shows a schematic view of an example of a flow of a process for substrate inspection in the probe apparatus.

Hereinafter, the operation of the probe apparatus will be described. It is assumed that the wafer W is not loaded into the probe apparatus main body 2, and the chuck top 55 is maintained in the probe apparatus main body 2; and in that state, the carrier C is transferred into the probe apparatus main body 2. First, as shown in FIG. 7A, the base 23 moves to a position at which the wafer W is transferred between the mounting table 21 for mounting thereon the carrier C and the first loader mechanism 30.

Figure 7B:
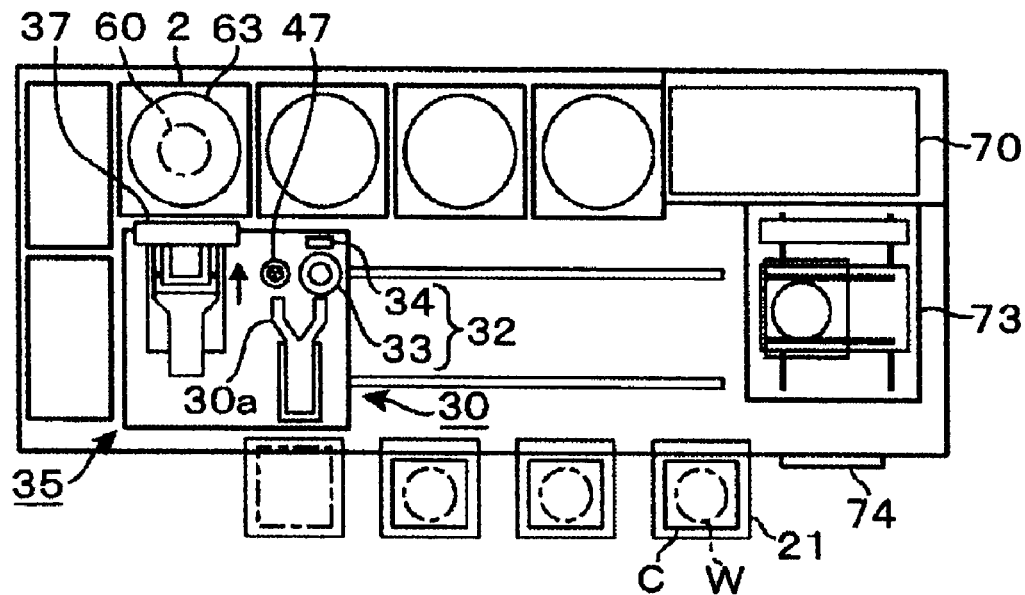
Figure 8A:
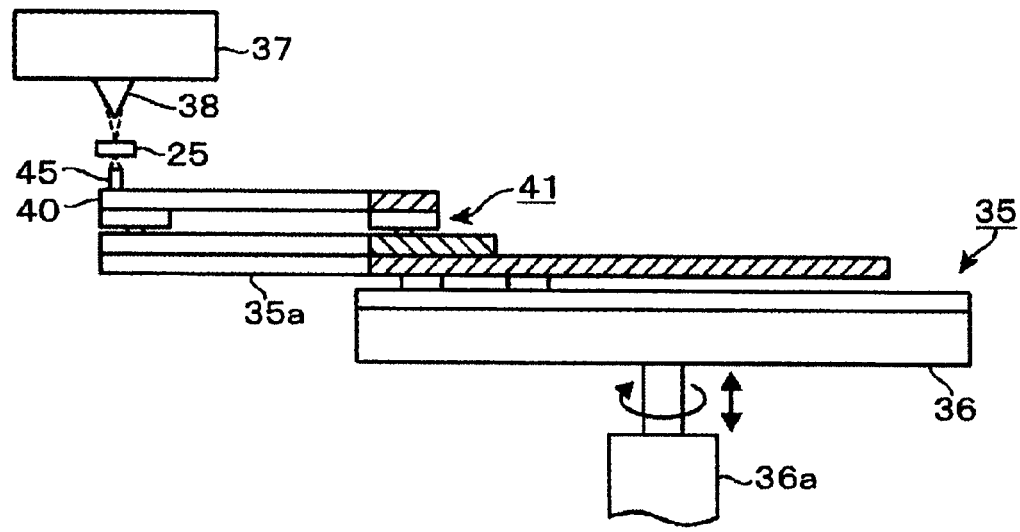
FIG. 8 illustrates a schematic view of an example of the flow of the process for substrate inspection in the probe apparatus.

Next, as illustrated in FIG. 7B, the second loader mechanism 35 moves so that the horizontal positions of the upper camera 38 and the lower camera 45 are aligned. Moreover, as depicted in FIG. 8A, the aforementioned focusing unit 25 is positioned between the upper camera 38 and the lower camera 45 and, also, a height position of the second loader mechanism 35 is adjusted so that the focus of the upper camera 38 coincides with that of the lower camera 45. The height position of the second loader mechanism 35 at that time is stored as an initial position. By setting, as the reference position, the position at which the focus of the upper camera 38 coincides with that of the lower camera 45, the probe needles 65 of the probe card 63 and the electrode pads of the IC chips on the wafer W can be treated as being imaged by a single camera.

Figure 7C:
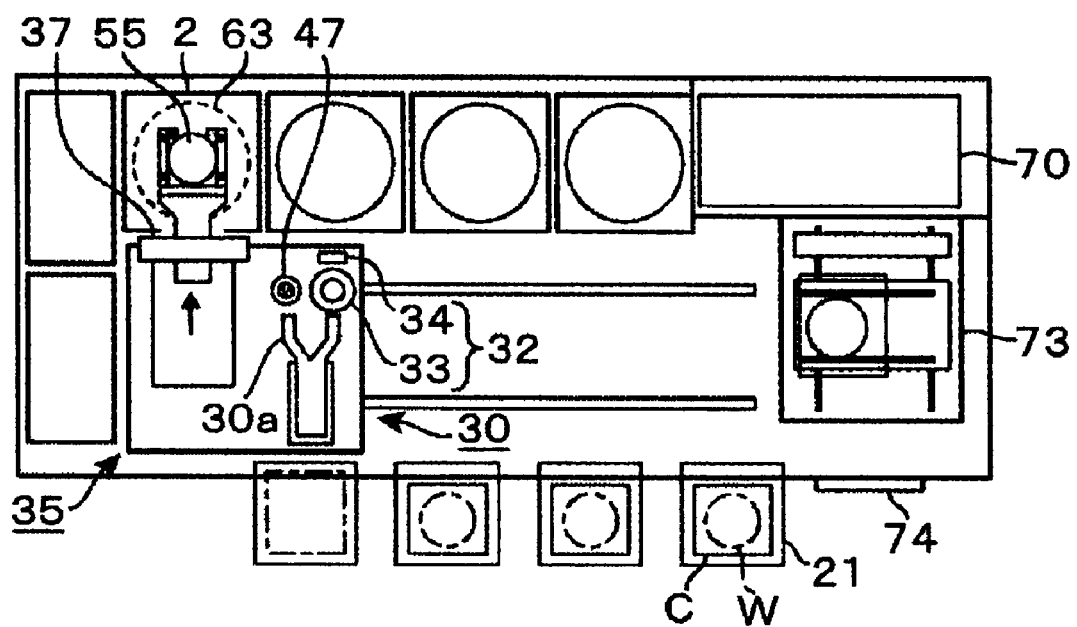
Figure 8B:
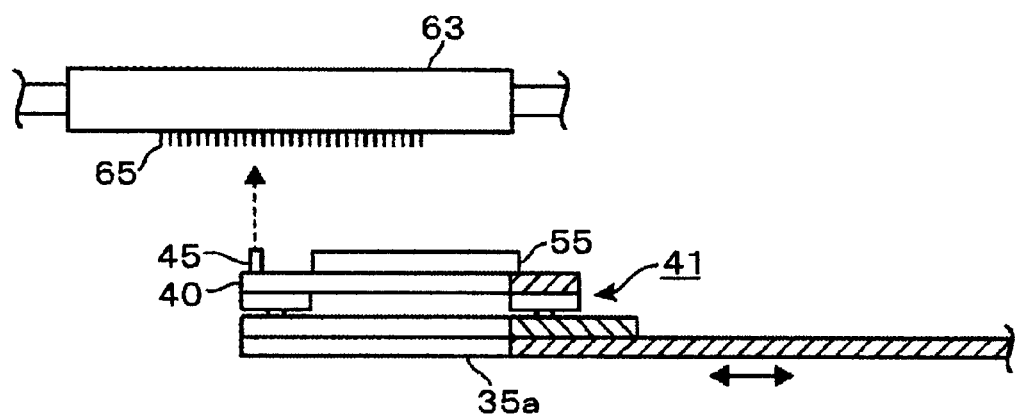
Figure 9A:
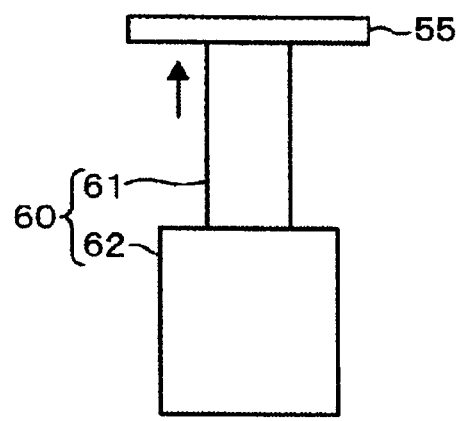
FIG. 9 depicts a schematic view of an example of the flow of the process for substrate inspection in the probe apparatus.
Figure 9B:
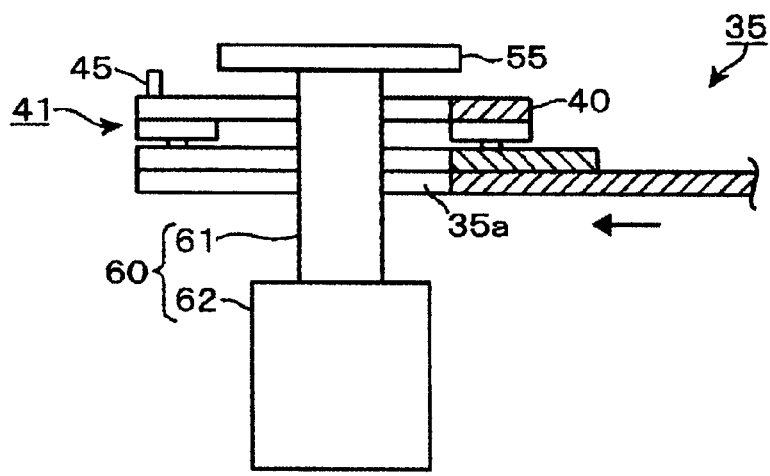
Figure 9C:
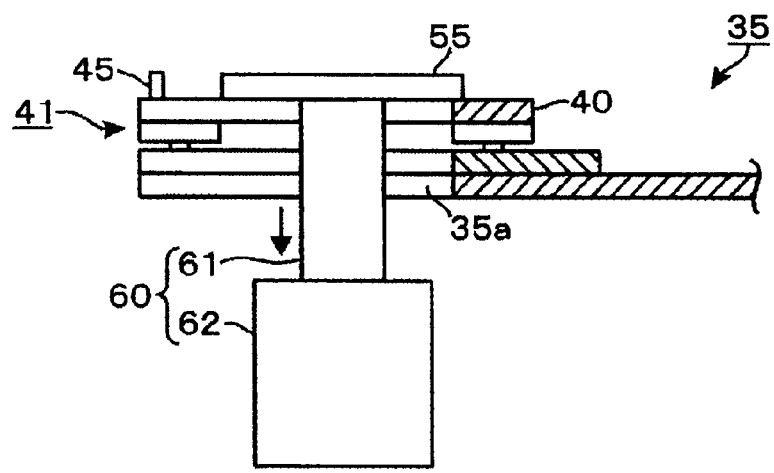

Next, as shown in FIG. 9A, the elevation unit 61 of the probe apparatus main body 2 is raised. At the same time, the second loader mechanism 35 is loaded into the probe apparatus main body 2, and the arm 35a moves to a position below the chuck top 55, as described in FIGS. 7C and 9B. Then, the elevation unit 61 is lowered to a lower position to mount the chuck top 55 on the X-Y-Θ stage 40 (FIG. 9C) and the chuck top 55 is adsorptively held thereon. Further, alignment marks provided at the probe card 63 are imaged by the lower camera 45 by driving the X-Y-Θ stage 40 and the second loader mechanism 35 (FIG. 8B). For example, two alignment marks are arranged at outer sides of the probe needles 65 in the probe card 63 along a reciprocating direction of the arm 35a, and the stop position of the arm 35a for each of the alignment marks is determined so that the alignment marks can be seen from the lower camera 45.

In imaging the alignment marks, the alignment mark positioned at the inner side when seen from the second loader mechanism 35 may be imaged first by extending the arm 35a and, then, the alignment mark positioned at the front portion is imaged by slightly retreating the arm 35a to the front portion. During the imaging process, the position of the lower camera 45 is finely adjusted via the X-Y-Θ stage 40 on the arm 35a so that the center of the alignment mark is positioned within an imaging area of the lower camera 45, e.g., on the center of the cross mark. The positions in the X and Y directions of the X-Y-Θ stage 40 at that time, i.e., the driving system coordinate positions according to a number of pulses of each encoder of a X direction drive motor and a Y direction drive motor in the X-Y-Θ stage 40, are stored in the storage unit in the control unit 5. Furthermore, the coordinate of the arm 35*a* at this time, i.e., the number of pulses of the encoder of the motor for moving the arm 35*a* back and forth, is stored in the storage unit. By imaging the two alignment marks, the control unit 5 can recognize the central position of the probe card 63 and the arrangement direction of the probe needles 65. The number of the alignment marks may appropriately designed to be larger than or equal to two. Besides, a specific probe needle 65 is imaged by the lower camera 45 such that the center of the corresponding probe needle 65 is made to coincide with the cross mark. The height position of the second loader mechanism 35 at that time (the number of the pulses of the encoder of the driving unit 36*a*) is stored in the storage unit.

Figure 10A:
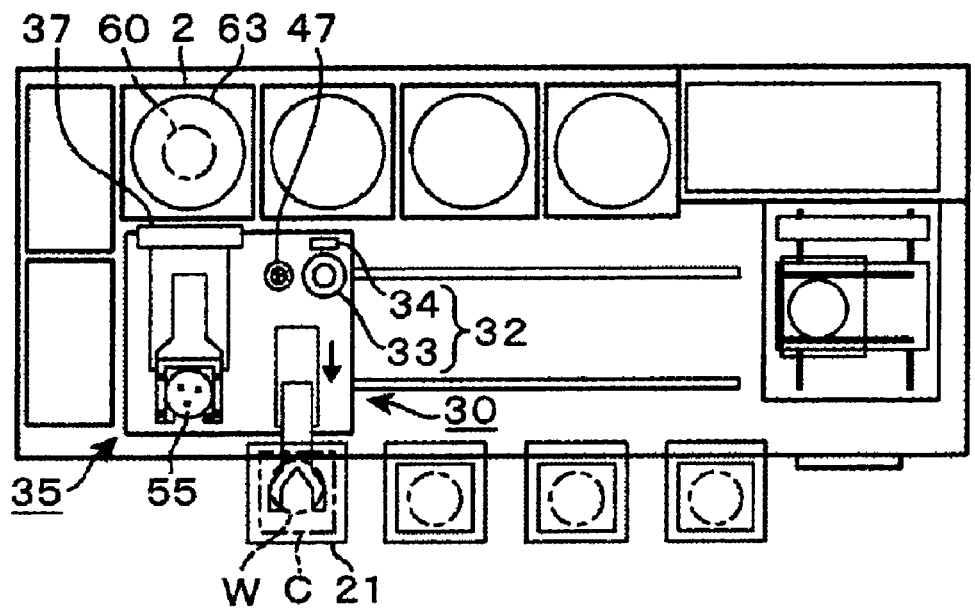
FIG. 10 shows a schematic view of an example of the flow of the process for substrate inspection in the probe apparatus.
Figure 10B:
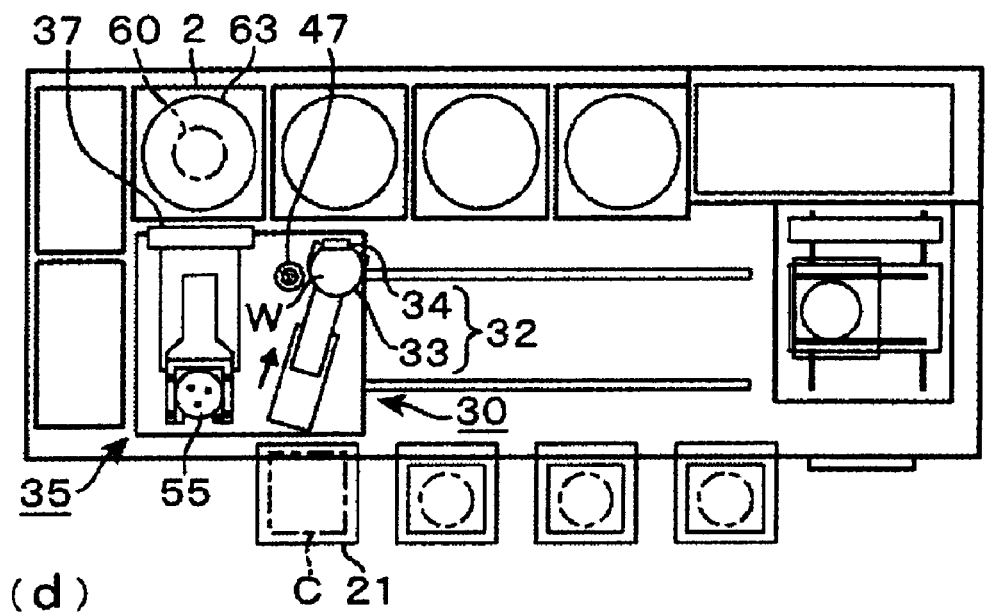
Figure 10C:
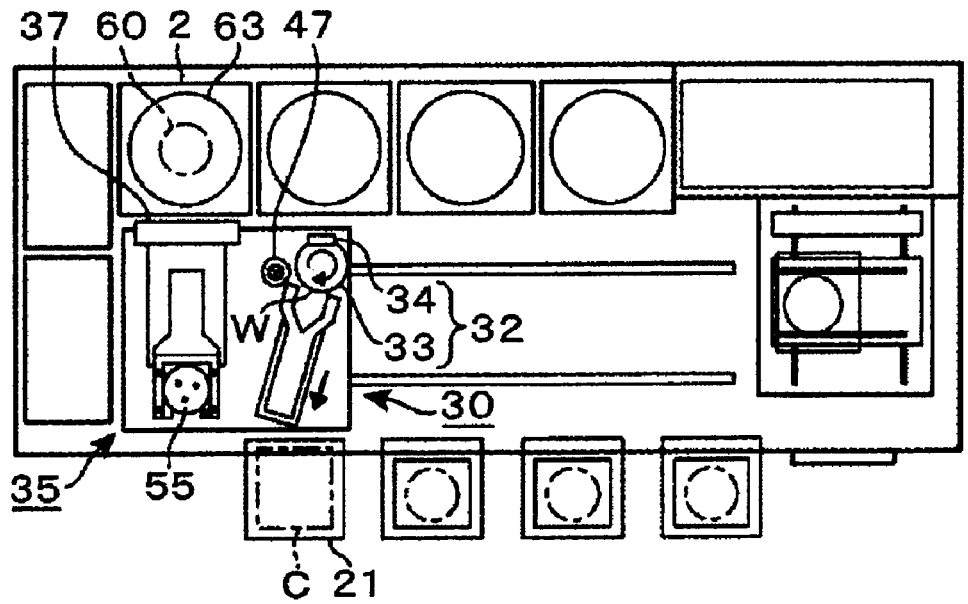

Next, the carrier C is mounted on the mounting table 21 by, e.g., an automatic guided vehicle (AGV) in a clean room. Thereafter, the carrier C is firmly pressed to the housing 20 side, so that the lid of the carrier C is separated from a shutter (not shown) of the housing 20. Then, the wafer W is unloaded from the carrier C by the first loader mechanism 30 (FIG. 10A), and the wafer W is mounted on the rotation table 33 of the pre-alignment unit 32 (FIG. 10B). In this pre-alignment unit 32, by emitting light from the top to the area including the circumferential portion of the wafer W and receiving the light reaching the bottom without being blocked by the circumferential portion while rotating the wafer W (360°), the position of the cutout formed on the circumferential portion of the wafer W is obtained and, also, the central position of the wafer W is calculated (FIG. 10C).

Figure 10D:
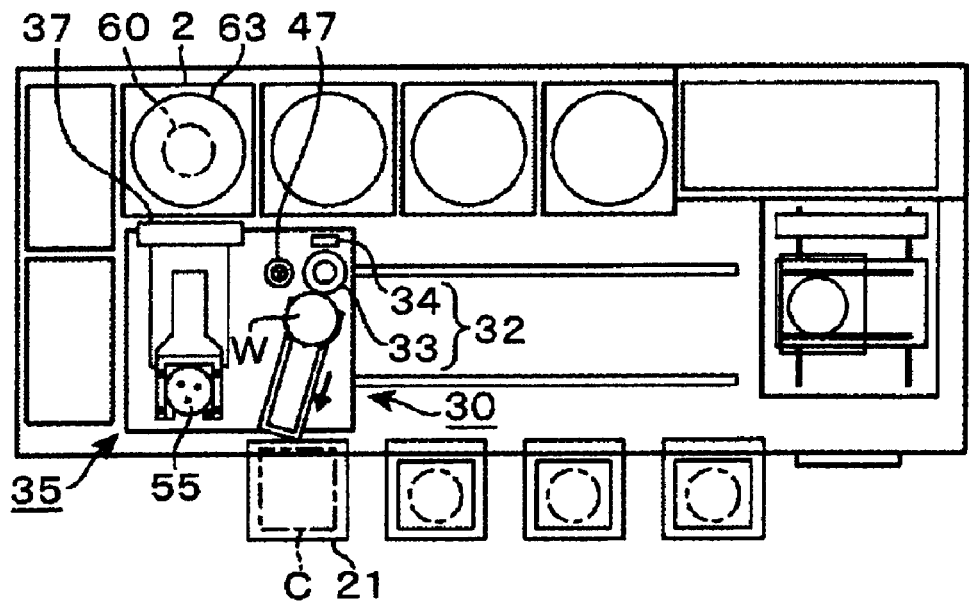

Next, the rotation table 33 rotates so that the wafer W is positioned in a predetermined direction, and the wafer W is received by adjusting the horizontal position of the first loader mechanism 30 so that the center of the wafer W is positioned at a predetermined position (FIG. 10D). Since the direction of the wafer W and the central position thereof are approximately aligned, the direction of the wafer W and the central position thereof are finely adjusted by the X-Y-Θ stage 40 of the second loader mechanism 35.

Figure 11A:
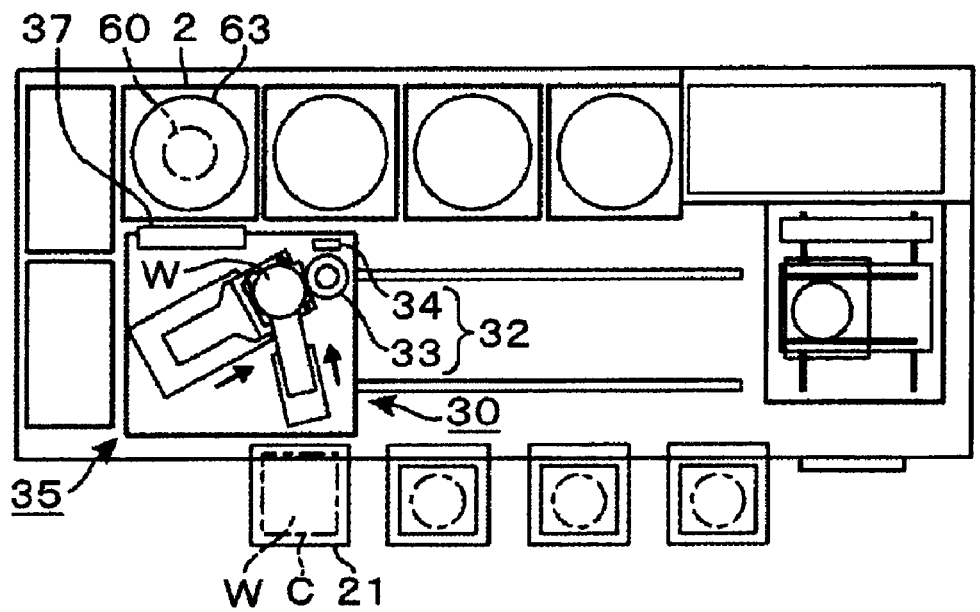
FIG. 11 provides a schematic view of an example of the flow of the process for substrate inspection in the probe apparatus.
Figure 12A:
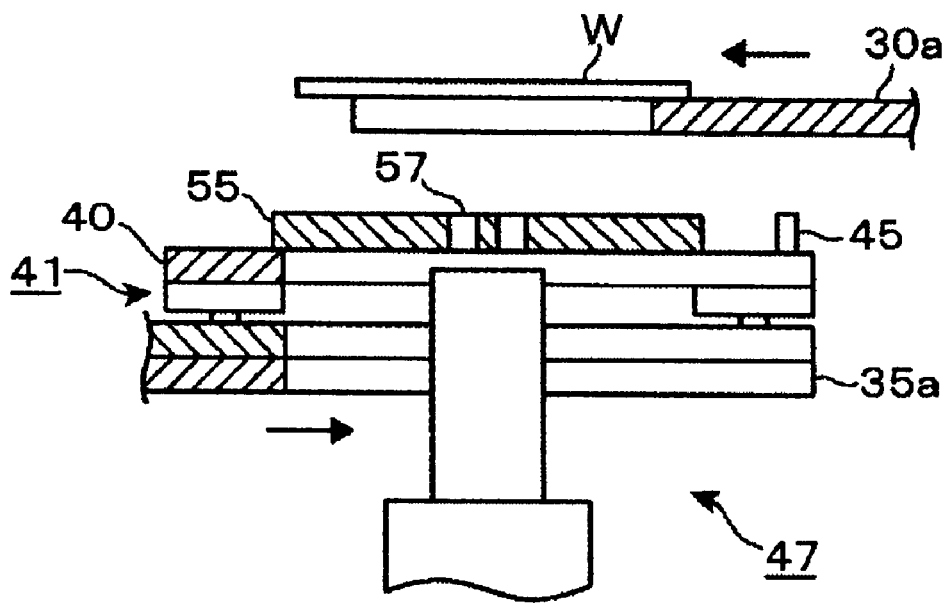
FIG. 12 is a schematic view of an example of the flow of the process for substrate inspection in the probe apparatus.
Figure 12B:
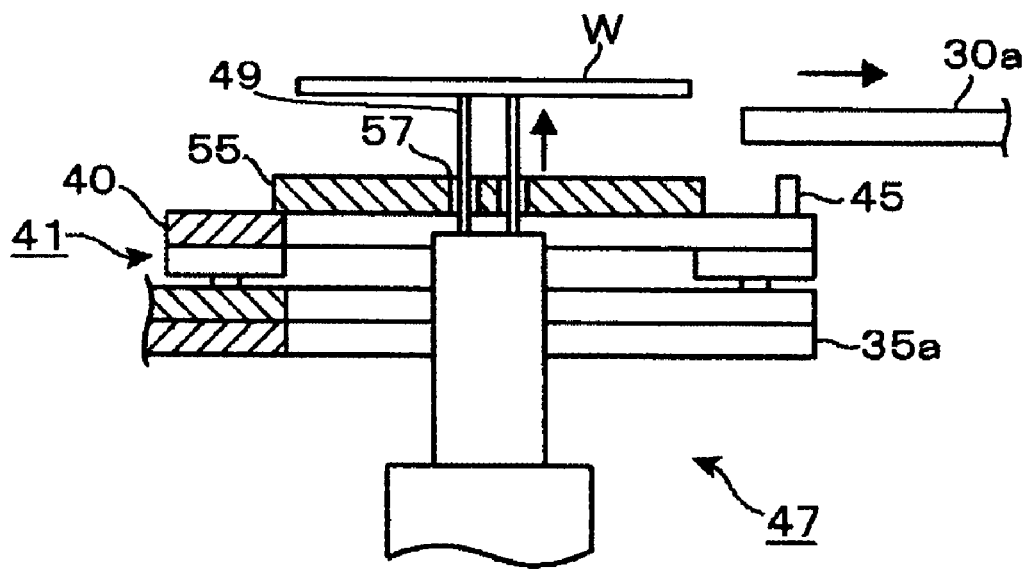
Figure 12C:
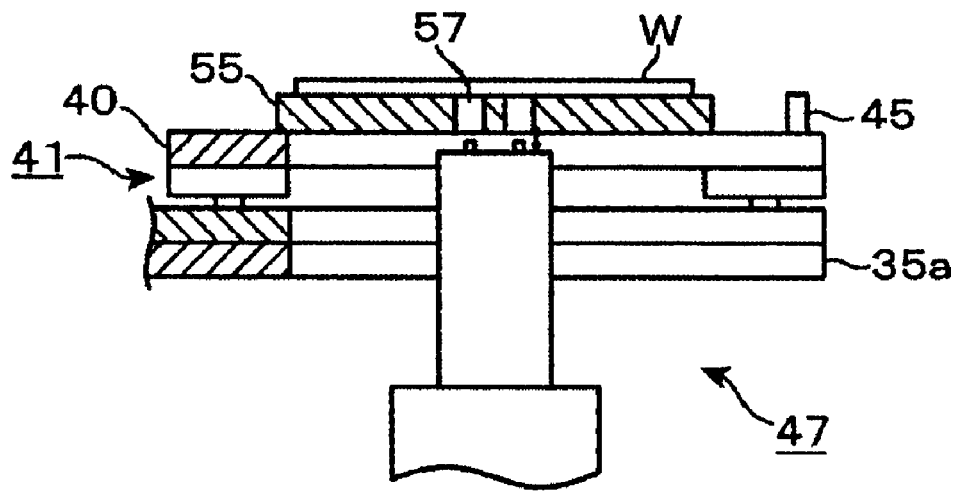

Next, as shown in FIGS. 11A and 12A, the second loader mechanism 35 moves so that the supporting unit 48 of the transfer mechanism 47 is received in the arm 35*a*, and the first loader mechanism 30 moves to make the wafer W to face the chuck top 55 on the second loader mechanism 35. Then, the wafer W is received by elevating the elevating pins 49, and the first loader mechanism 30 is retreated (FIG. 12B). Thereafter, the wafer W is adsorptively held on the chuck top 55 by lowering the elevating pins 49 (FIG. 12C).

Figure 11B:
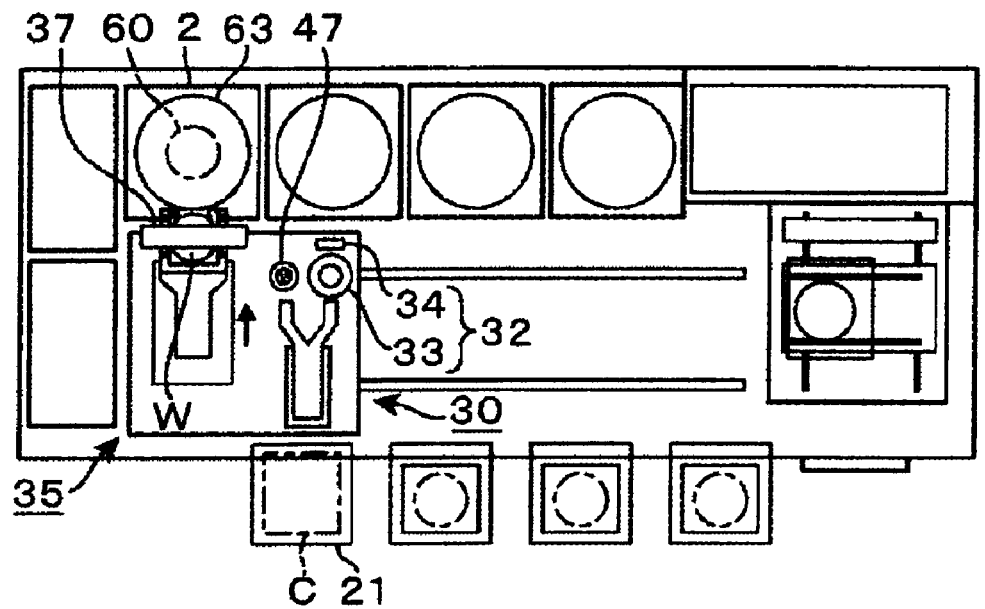
Figure 13:
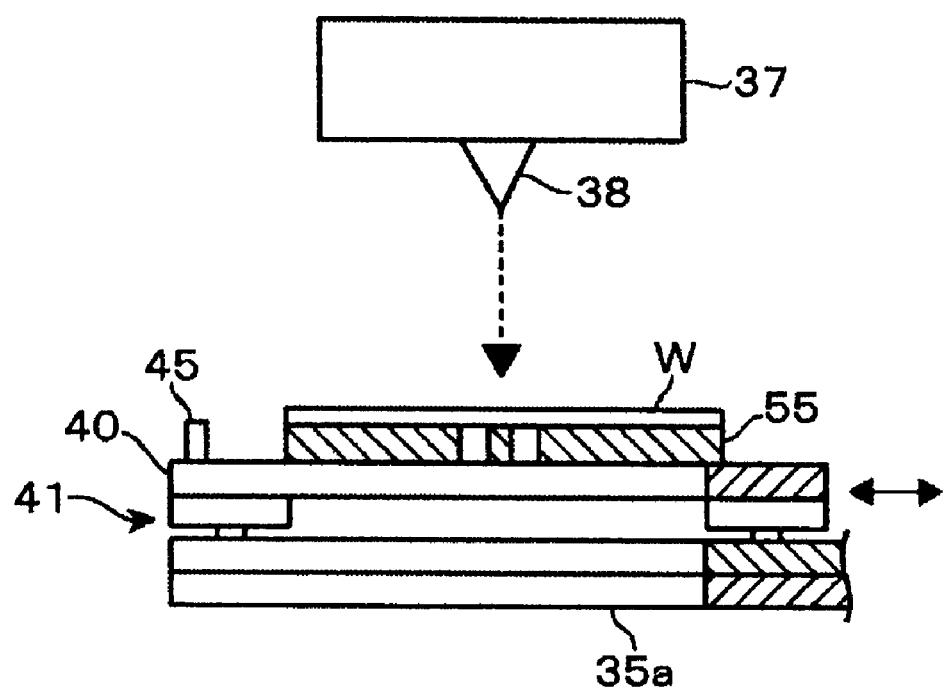
FIG. 13 describes a schematic view of an example of the flow of the process for substrate inspection in the probe apparatus.

Moreover, as depicted in FIGS. 11B and 13, the second loader mechanism 35 rotates in the same direction as when the probe needles 65 are imaged. Further, the arm 35 moves back and forth below the alignment bridge 37 and, also, the X-Y-Θ stage 40 moves in the Y direction. Accordingly, specific points on the wafer W, e.g., two points positioned in the circumferential portion of the wafer to face in a diameter direction with respect to the center of the wafer W, are imaged by the lower camera 38. The specific points may be alignment marks, electrode pads or corner portions of a specific IC chip.

The position in the X and Z directions of the arm 35*a* of the second loader mechanism 35 and the position in the X and Y directions of the X-Y-Θ stage 40 which are obtained by the imaging process, are respectively stored, as the number of pulses of an encoder of each motor, in the storage unit of the control unit 5. Moreover, based on the obtained images of the probe needles 65 and that of the surface of the wafer W which are imaged by the lower camera 45 and the upper camera 38 whose focuses coincide with each other, the position of the driving system for making a whole contact between the probe needles 65 and the electrode pads of the IC chips on the wafer W at a time is calculated.

Specifically, for example, when the wafer W needs to contact with the probe needles 65 by raising the second loader mechanism 35 after the arm 35*a* of the second loader mechanism 35 is loaded into a specific position (measuring position) in the probe apparatus main body 2, the position in the X, Y and Θ directions of the X-Y-Θ stage 40 and the height position of the arm 35*a* are calculated, thus carrying out the fine alignment.

Figure 11C:
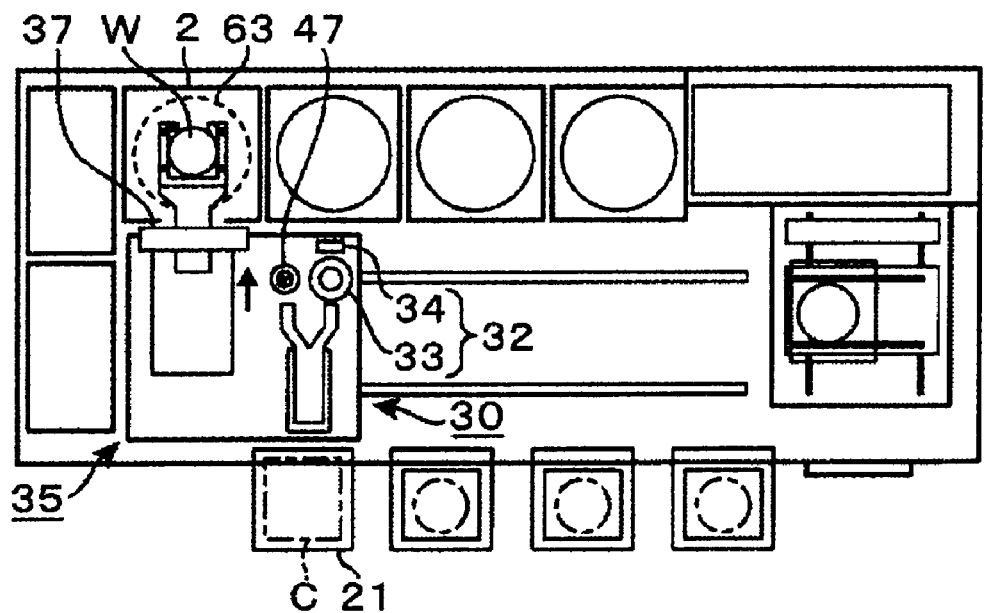
Figure 11D:
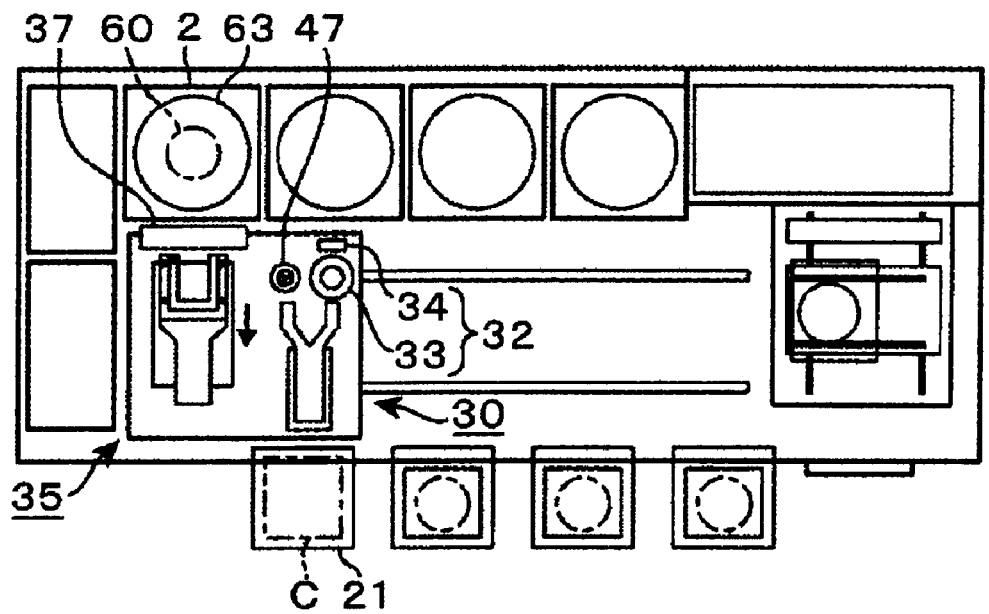
Figure 14A:
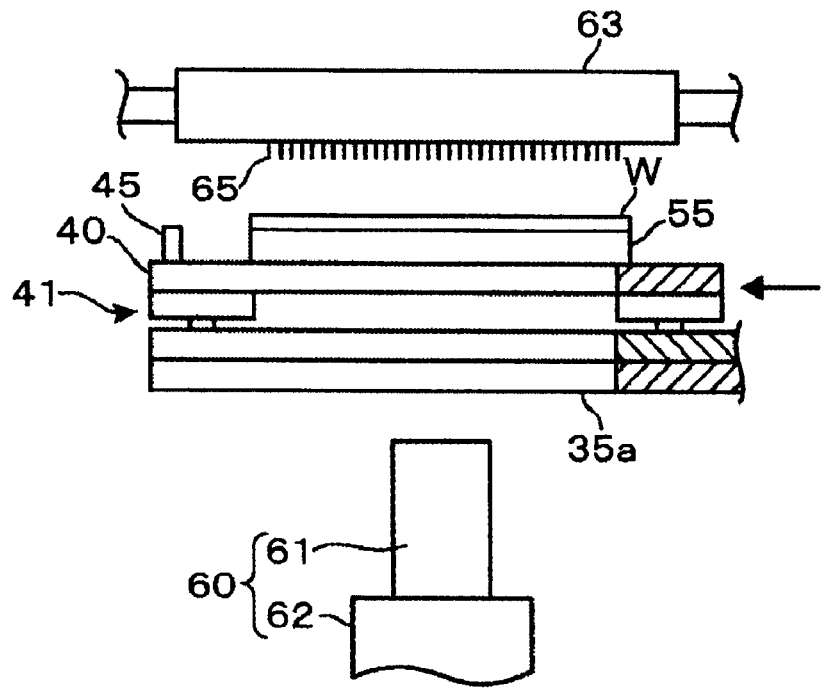
FIG. 14 presents a schematic view of an example of the flow of the process for substrate inspection in the probe apparatus.
Figure 14B:
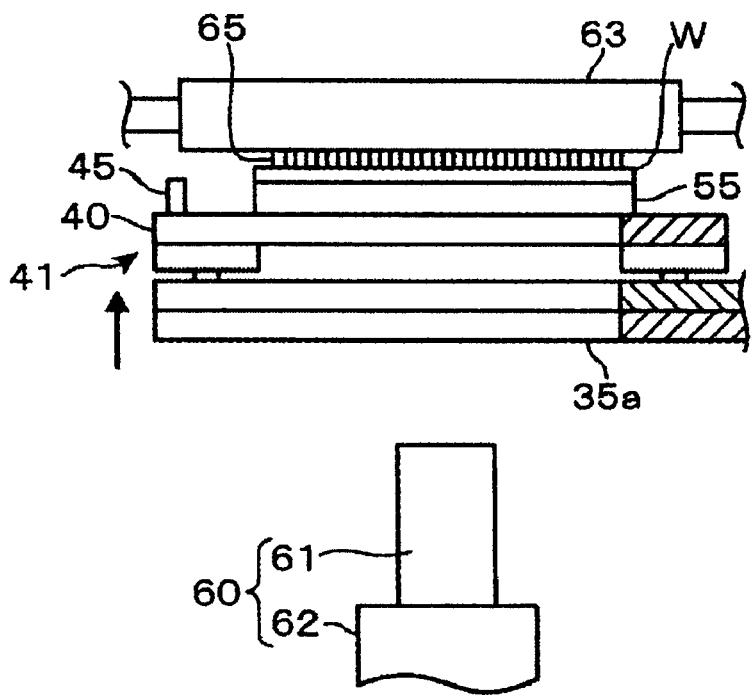
Figure 15A:
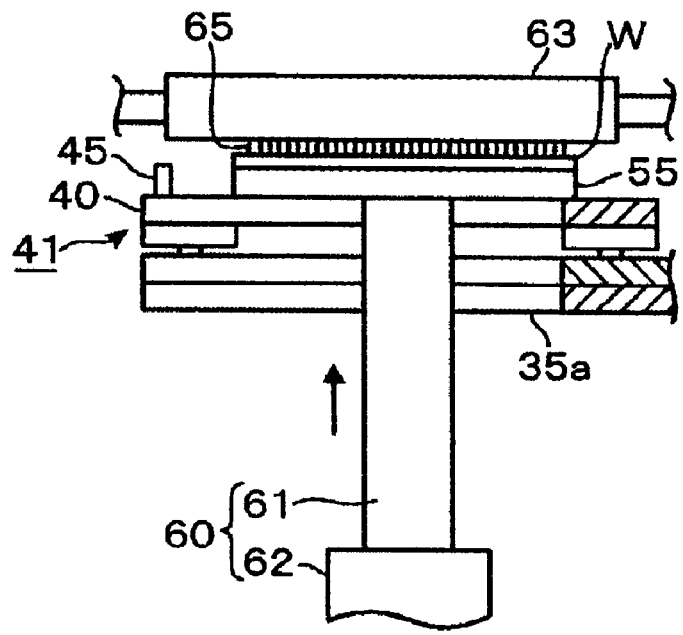
FIG. 15 represents a schematic view of an example of the flow of the process for substrate inspection in the probe apparatus.
Figure 15B:
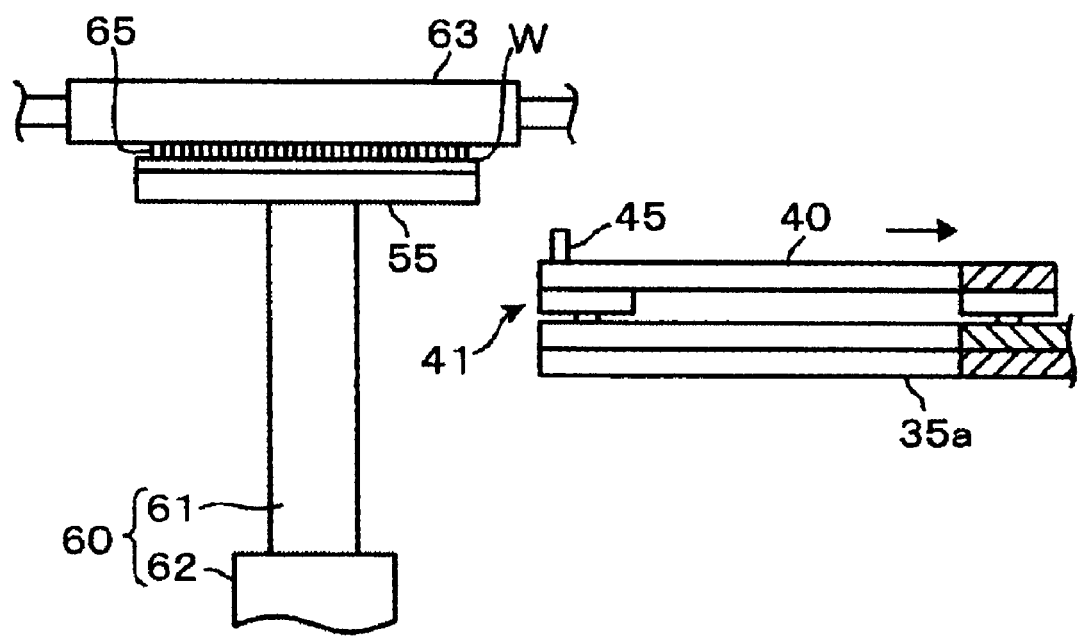

Thereafter, as shown in FIGS. 11C and 14A, the second loader mechanism 35 is loaded into the measuring position in the probe apparatus main body 2, and the position in the X, Y and Θ directions of the X-Y-Θ stage 40 is adjusted to the aforementioned contact position. Next, the second loader mechanism 35 is raised until the probe needles 65 are made to contact with the electrode pads on the wafer W (FIG. 14B), and then is raised by a predetermined amount to perform a so-called overdrive. Then, the elevation unit 61 is raised to the upper position at which the elevation unit 61 contacts with the chuck top 55, and the load of the chuck top 55 is transferred from the second loader mechanism 35 to the elevation unit 61 (FIG. 15A). Next, the adsorption support of the second loader mechanism 35 is released and, at the same time, the second loader mechanism 35 is lowered and retreated to the outside of the probe apparatus main body 2 (FIGS. 15B and 11D). At this time, although the wafer W is not adsorptively held on the chuck top 55, the probe needles 65 are pushed into the electrode pads on the wafer W as described above. Thus, the wafer W is held on the elevation unit 61 without misalignment.

Figure 16:
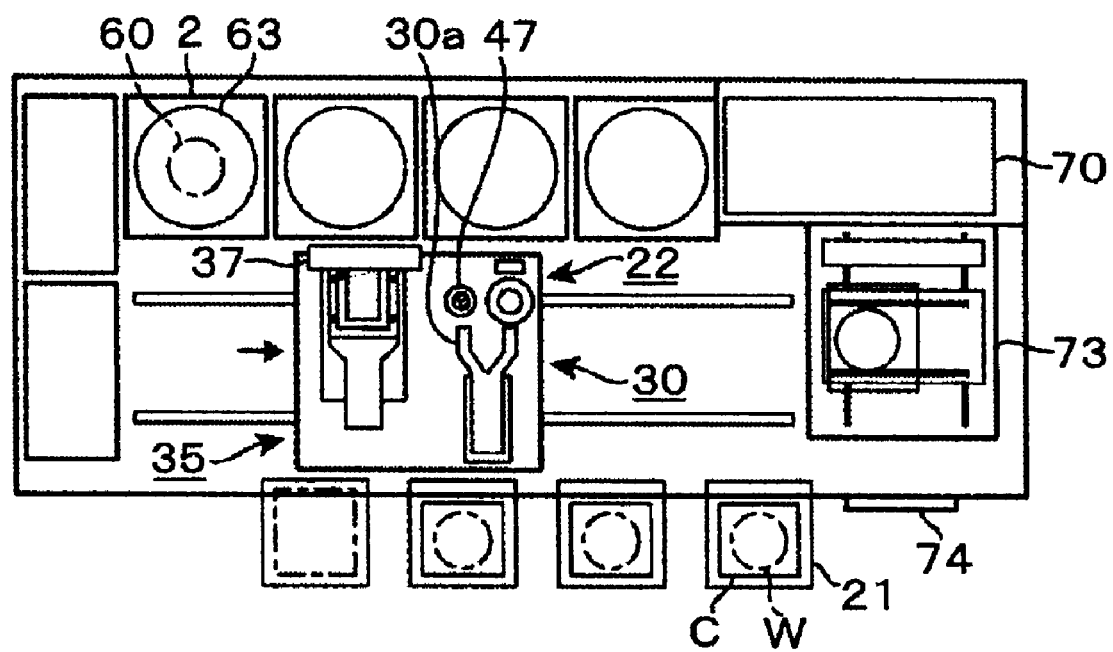
FIG. 16 describes a schematic view of an example of the flow of the process for substrate inspection in the probe apparatus.

Thereafter, the chips to be inspected are inspected by supplying electrical signals for a specific test to the electrode pads of the wafer W via the test head 67, the pogo ring 66, the probe card 63 and the probe needles 65. When a next wafer W is inspected, the base 23 moves to the right side, as illustrated in FIG. 16. Further, the focus of the upper camera 38 is made to coincide with that of the lower camera 45, and the second loader mechanism 35 is loaded into a next probe apparatus main body 2B.

In that state, the chuck top 55 is received by the second loader mechanism 35; the probe needles 65 are imaged; and the coordinate position of the second loader mechanism 35 is adjusted. Next, the base 23 moves to the left side by retreating the second loader mechanism 35, and a next wafer W is loaded into the loader unit 1. In that state, the pre-alignment of the wafer W, the transfer of the wafer W, the imaging of the wafer W and the position adjustment by the X-Y-Θ stage 40 are carried out. Thereafter, the base 23 moves to the right side again to thereby inspect a next wafer W.

Figure 17A:
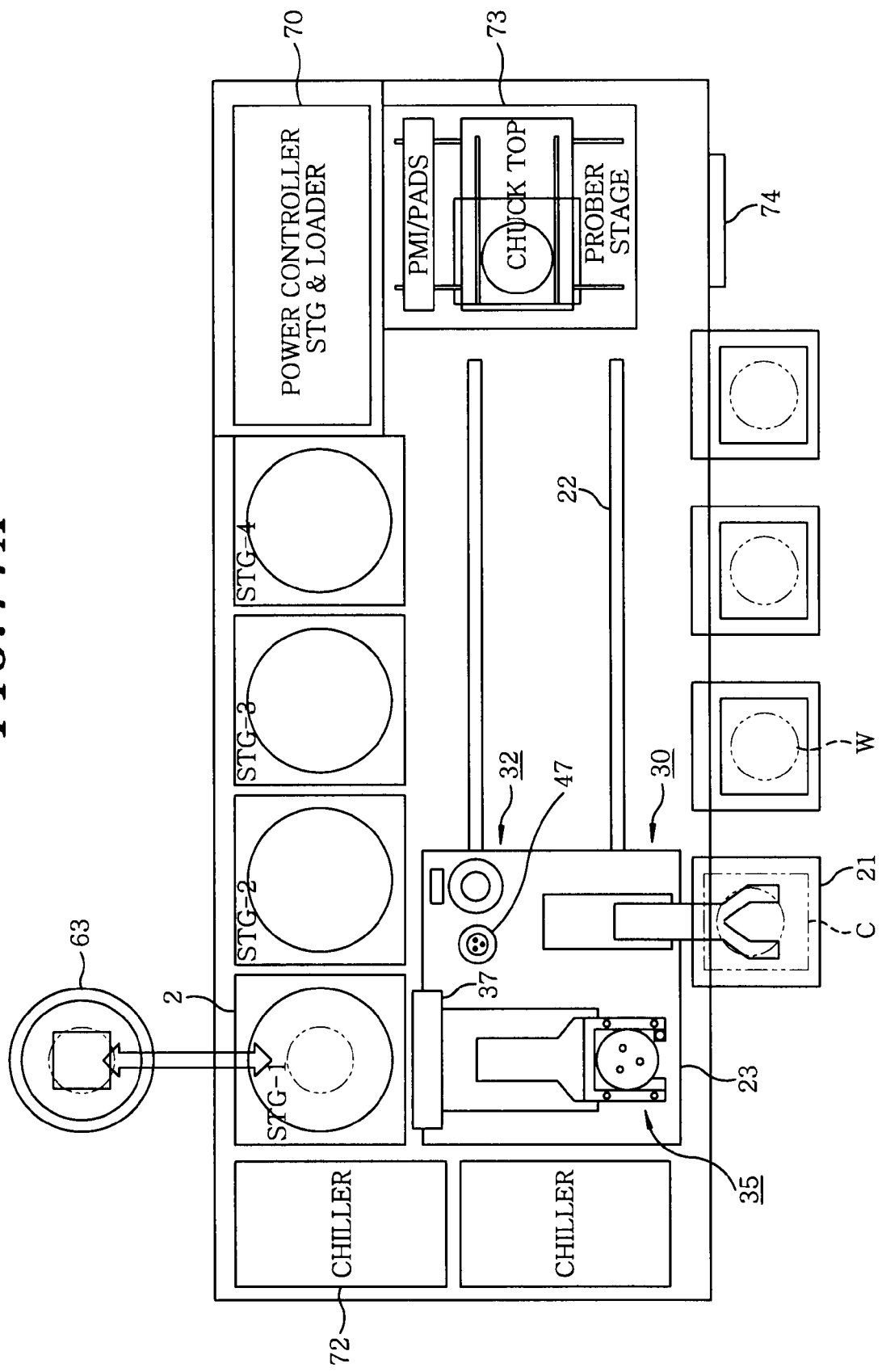
FIG. 17 offers a schematic view of an example of the flow of the process for substrate inspection in the probe apparatus.
Figure 17B:
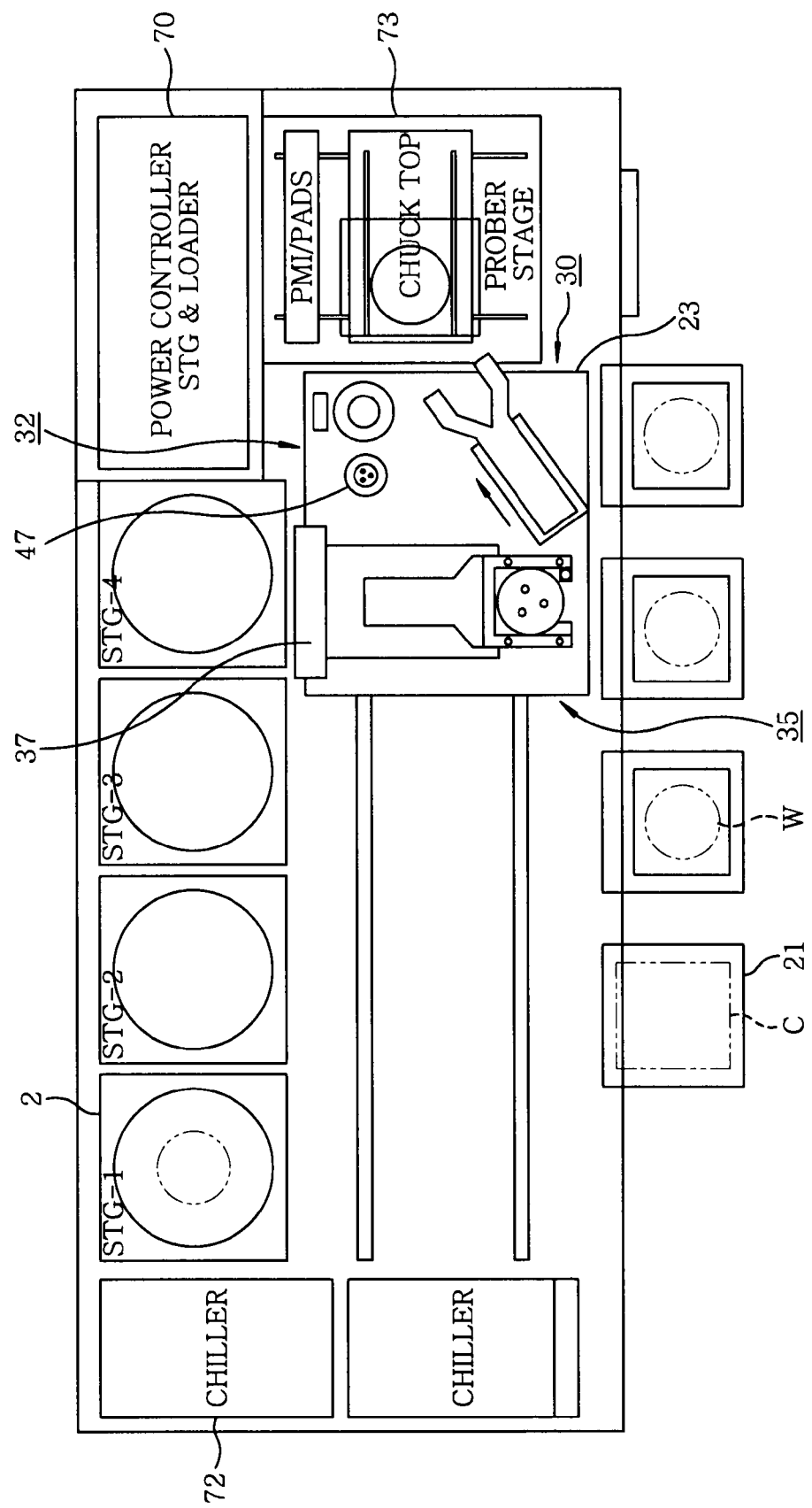

Then, the next wafer W is inspected in the above-described manner, and the inspected wafer W is returned to the carrier C in the reverse sequence. Further, when the probe card 63 needs to be exchanged, the test head 67 is raised, and the probe card 63 is unloaded and loaded together with the head plate 64 from and into the inside of the probe apparatus main body 2, as can be seen from FIG. 17A. In addition, when the alignment of the wafer W needs to be performed, the base 23 move to the right side to be near the prober stage 73, as illustrated in FIG. 17B.

In accordance with the above embodiment, the probe apparatus has a plurality of probe apparatus main bodies 2 for inspecting chips to be inspected while bringing the electrode pads of the chips to be inspected into contact with the probe needles 65 of the probe card 63 in a state where the wafer W on which the chips to be inspected are arranged is maintained on the chuck top 55. Further, the loader unit 1 for transferring the wafer W between the carriers C and the probe apparatus main bodies 2 includes: the upper camera 38 for imaging the arrangement of the chips to be inspected of the wafer W; the lower camera 45 for imaging the probe needles 65; the second loader mechanism 35; and the X-Y-Θ stage 40 for adjusting the position of the wafer W.

With the above configuration, the fine alignment of the wafer W is performed by the loader unit 1 and, thus, the fine alignment operation in each of the probe apparatus main bodies 2 (2A to 2D) can be performed by commonly using the loader unit 1. Accordingly, the movement region of the wafer W does not need to be ensured in the probe apparatus main bodies 2, which allows the probe apparatus to be scaled down. Besides, there arises no need to provide the X-Y-Θ stage 40 in the probe apparatus main bodies 2, so that the manufacturing cost can be reduced. The effects of miniaturization and cost reduction of the apparatus increases as the number of the probe apparatus main bodies 2 increases.

Since the operation of transferring the wafer W from the second loader mechanism 35 to the elevation unit 61 is performed in a state where the wafer W is brought into contact with the probe needles 65, the positional displacement can be reliably prevented, which is preferable. Such operation may also be performed by raising the wafer W mounted on the second loader mechanism 35 by the elevation unit 61.

In the above example, the alignment marks of the probe card 63 are arranged in the reciprocating direction of the arm 35a of the second loader mechanism 35, and the specific points for alignment are arranged on the wafer W. In that state, those points are imaged by moving the second loader mechanism 35 back and forth. However, alignment marks of the probe card 63 can be imaged by two lower cameras 45 provided at both sides of the leading end portion of the X-Y-Θ stage 40 while moving the X-Y-Θ stage 40 in the Y direction, the alignment marks being spaced from each other at an interval corresponding to a gap between the lower cameras 45.

Furthermore, two specific points on the wafer W can be imaged by two upper cameras 38 provided at both sides of the alignment bridge 37 to correspond to the specific points while moving the X-Y-Θ stage 40 in the Y direction. Besides, when the alignment marks on the wafer W are picked up by the upper cameras 38, the alignment bridge 37 can move in the Y direction instead of moving the X-Y-Θ stage 40 in the Y direction. In that case, when the specific points on the wafer W are imaged by the upper cameras 38, the position of the alignment bridge 37 is stored in the storage unit of the control unit 5 together with the position of the second loader mechanism 37 and the position of the X-Y-Θ stage 40 according to the number of pulses of the encoder of the motor of the alignment bridge 37.

Figure 18A:
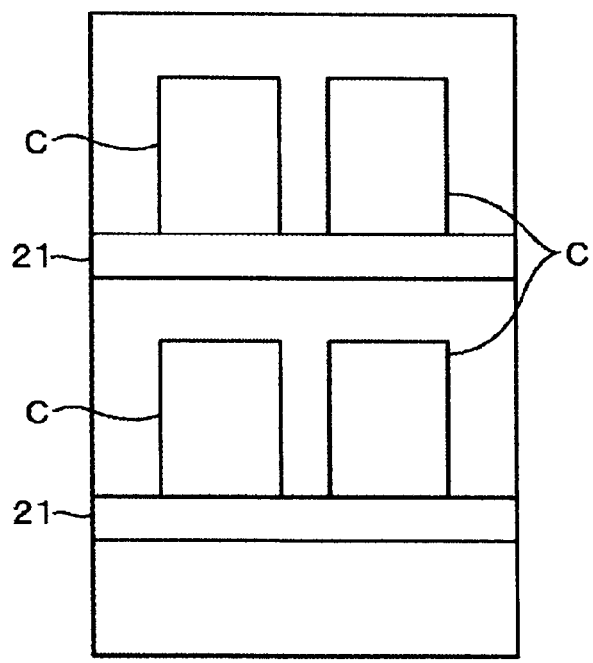
FIG. 18 sets forth a schematic view showing another example of the probe apparatus.
Figure 18B:
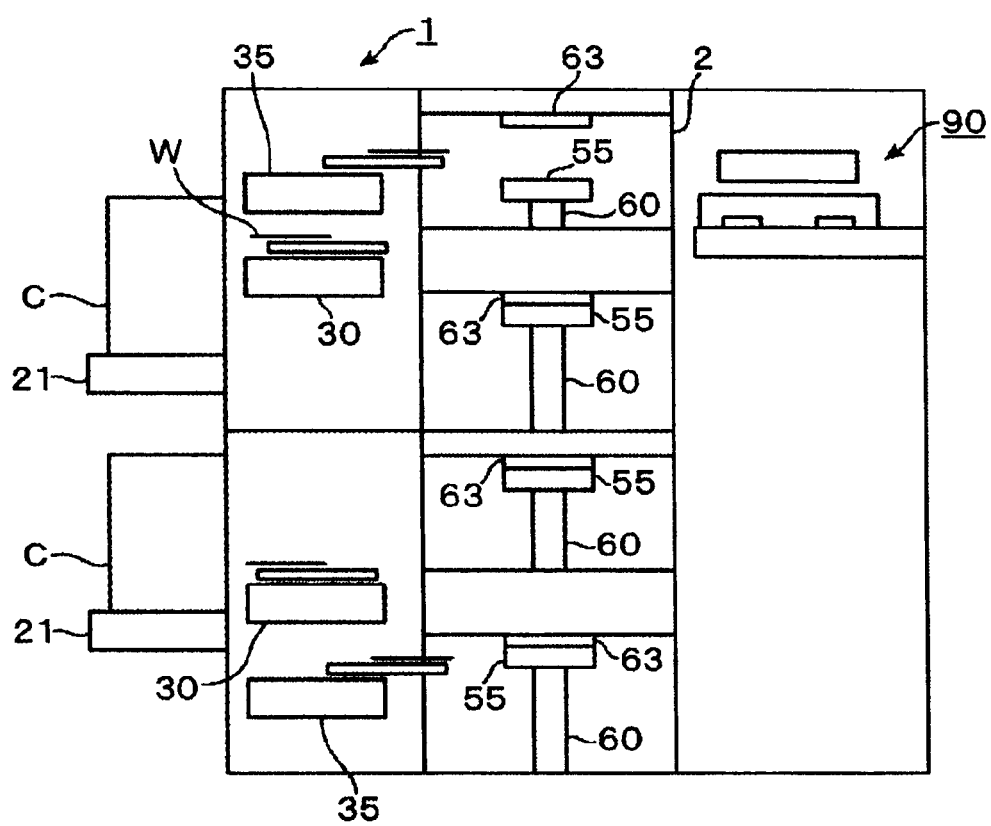

In the above example, there are provided four probe apparatus main bodies 2. However, the number thereof may be, e.g., two or more. Further, although the probe apparatus main bodies 2 are horizontally arranged in the above example, the probe apparatus main bodies 2 may be laminated in the height direction, as illustrated in FIGS. 18A and 18B. In that case, the loader unit 1 having the first loader mechanism 30, the second loader mechanism 35, the pre-alignment unit 32, the transfer mechanism 47 and the alignment bridge 37 may be provided at the height position for each of the probe apparatus main bodies 2. Or, as shown in FIG. 18B, the wafer W may be transferred between a plurality of, e.g., two-story probe apparatus main bodies 2 by a single loader unit 1. Moreover, a reference numeral 90 indicates a carrier for exchanging the probe cards 63.

In the above example, the probe apparatus main bodies 2 are arranged horizontally, and the base 23 moves in parallel with the arrangement of the probe apparatus main bodies 2. However, the probe apparatus main bodies 2 may be provided to surround the base 23. In that case, the base 23 may rotate without moving in the horizontal direction.

While the invention has been shown and described with respect to the embodiments, it will be understood by those skilled in the art that various changes and modification may be made without departing from the scope of the invention as defined in the following claims.

What is claimed is:

1. A probe apparatus for inspecting a plurality of chips to be inspected by mounting on a substrate mounting table a substrate on which the chips are arranged and making a contact between probes of a probe card and electrode pads of the chips at a time, the probe apparatus comprising:

a load port for mounting thereon a carrier accommodating therein a plurality of substrates;

a plurality of probe apparatus main bodies, each having a supporting unit for detachably supporting the substrate mounting table and vertically moving the substrate mounting table between an upper portion at which the electrode pads of the chips on the substrate contact with the probes of the probe card and a lower portion at which the substrate mounting table is transferred;

a loader unit for transferring the substrate between the carrier of the load port and the probe apparatus main bodies; and a control unit for outputting a control signal to the loader unit and the probe apparatus main bodies, wherein the loader unit includes: a substrate transfer mechanism for transferring the substrate to and from the carrier; a mounting table transfer mechanism provided commonly for the supporting units in the probe apparatus main bodies, for transferring the substrate mounting table to and from the supporting unit; a rotation unit provided with the mounting table transfer mechanism, for rotating the substrate mounting table about a vertical axis; an XY moving unit for moving the rotation unit in X and Y directions; a first image imaging device provided at a portion which rotates by the rotation unit, for imaging the probes of the probe card; and a second image imaging device for imaging the electrode pads of the chips of the substrate mounted on the substrate mounting table on the mounting table transfer mechanism, and wherein the control unit adjusts, based on imaging results obtained by the first and the second imaging device of each of the probe apparatus main bodies, the position of the substrate mounting table on the mounting table transfer mechanism via the rotation unit and the XY moving unit so that the chips are made to contact with the probes, and outputs a control signal to transfer the substrate mounting table of which position has been adjusted from the mounting table transfer mechanism to a supporting unit of a corresponding probe apparatus main body and also to bring the electrode pads of the substrate on the substrate mounting table into contact with the probes.

2. The probe apparatus of claim 1, wherein the mounting table transfer mechanism has an elevation mechanism for elevating the XY moving unit, and wherein an operation of transferring the substrate mounting table from the mounting table transfer mechanism to the supporting unit of the corresponding probe apparatus main body and bringing the electrode pads of the substrate on the substrate mounting table into contact with the probes is performed by transferring the substrate mounting table from the mounting table transfer mechanism to the supporting unit in a state where the electrode pads of the substrate on the substrate mounting table are brought into contact with the probes of the corresponding probe apparatus main body by the mounting table transfer mechanism.

3. The probe apparatus of claim 1, wherein the mounting table transfer mechanism has a transfer mechanism main body for transferring the substrate mounting table, and the XY moving unit is provided at the transfer mechanism main body.

4. The probe apparatus of claim 1, wherein the probe apparatus main bodies are horizontally arranged, and the loader unit is movable in parallel with the arrangement of the probe apparatus main bodies.

5. The probe apparatus of claim 1, further comprising a transfer unit for transferring the substrate between the substrate transfer mechanism and the mounting table transfer mechanism.

6. The probe apparatus of claim 5, wherein the transfer unit has elevating pins for elevating the substrate; the substrate mounting table has through holes through which the elevating pins penetrate; and the substrate is raised by the elevating pins penetrating the substrate mounting table and then is transferred between the substrate transfer mechanism and the mounting table transfer mechanism.

7. A probing method for inspecting a plurality of chips to be inspected by mounting on a substrate mounting table a substrate on which the chips are arranged and making a contact between probes of a probe card and electrode pads of the chips, the probing method comprising steps of:

unloading the substrate from a carrier accommodating therein a plurality of substrate by a substrate transfer mechanism;

transferring the substrate onto the substrate mounting table supported at a portion which rotates by a rotation unit by the substrate transfer mechanism with the use of the mounting table transfer mechanism including the rotation unit for rotating the substrate mounting table about a vertical axis and an XY moving unit for moving the rotation unit in X and Y directions;

imaging probes of a probe card of a probe apparatus main body selected from a plurality of probe apparatus main bodies by a first imaging device provided at a portion which rotates by the rotation unit;

imaging the electrode pads of the chips to be inspected of the substrate mounted on the substrate mounting table on the mounting table transfer mechanism by a second imaging device provided outside the probe apparatus main bodies;

adjusting a position of the substrate mounting table on the mounting table transfer mechanism via the rotation unit and the XY moving unit so that the chips and the probes are made to contact with each other based on the imaging results obtained by the first and the second imaging device in each of the probe apparatus main bodies; and transferring the substrate mounting table of which position has been adjusted from the mounting table transfer mechanism to a supporting unit of a corresponding probe apparatus main body and bringing the electrode pads of the substrate on the substrate mounting table into contact with the probes.

8. The probing method of claim 7, wherein the step of transferring the substrate mounting table from the mounting table transfer mechanism to the supporting unit of the corresponding probe apparatus main body and bringing the electrode pads of the substrate on the substrate mounting table into contact with the probes is performed by transferring the substrate mounting table from the mounting table transfer mechanism to the supporting unit in a state where the electrode pads of the substrate on the substrate mounting table are brought into contact with the probes of the corresponding probe apparatus main body by the mounting table transfer mechanism.

9. The probing method of claim 7, wherein the step of adjusting the substrate mounting table is performed by the XY moving unit provided at the transfer mechanism main body of the mounting table transfer mechanism.

10. The probing method of claim 7, wherein the probe apparatus main bodies are horizontally arranged, and when the mounting table is transferred to the probe apparatus main body selected from the probe apparatus main bodies, the mounting table transfer mechanism moves in parallel with the arrangement of the probe apparatus main bodies so that the mounting table is transferred between the corresponding probe apparatus main body and the mounting table transfer mechanism.

11. The probing method of claim 7, wherein the step of transferring the substrate on the substrate mounting table is performed by a transfer unit for transferring the substrate between the substrate transfer mechanism and the mounting table transfer mechanism.

12. The probing method of claim 11, wherein the transfer unit has elevating pins for elevating the substrate; the substrate mounting table has through holes through which the elevating pins penetrate; and wherein the step of transferring the substrate to the substrate mounting table is performed by transferring the substrate between the substrate transfer mechanism and the mounting table transfer mechanism in a state where the substrate is raised by the elevating pins penetrating the substrate mounting table.

13. A computer-executable storage medium storing therein a computer program, wherein the computer program has steps for performing the probing method described in claim 7.

* * * * *